United States Patent
Nagatsuka et al.

(10) Patent No.: US 9,697,878 B2
(45) Date of Patent: Jul. 4, 2017

(54) WORD LINE DIVIDER AND STORAGE DEVICE

(75) Inventors: Shuhei Nagatsuka, Atsugi (JP); Takanori Matsuzaki, Atsugi (JP); Hiroki Inoue, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 637 days.

(21) Appl. No.: 13/472,789

(22) Filed: May 16, 2012

(65) Prior Publication Data
US 2012/0294061 A1 Nov. 22, 2012

(30) Foreign Application Priority Data
May 20, 2011 (JP) .................................. 2011-113011

(51) Int. Cl.
| | | |
|---|---|---|
| *G11C 5/06* | (2006.01) | |
| *G11C 8/14* | (2006.01) | |
| *G11C 11/408* | (2006.01) | |
| *G11C 8/08* | (2006.01) | |

(52) U.S. Cl.
CPC .................. *G11C 8/14* (2013.01); *G11C 8/08* (2013.01); *G11C 11/408* (2013.01); *G11C 11/4087* (2013.01); *G11C 2216/14* (2013.01)

(58) Field of Classification Search
CPC .......................... H01L 27/11502; H01L 27/108
USPC .................. 365/230.06, 72, 149, 145, 51
See application file for complete search history.

(56) References Cited

U.S. PATENT DOCUMENTS

| | | |
|---|---|---|
| 4,596,003 A | 6/1986 | Shimizu |
| 5,517,456 A | 5/1996 | Chishiki |
| 5,629,898 A | 5/1997 | Idei et al. |
| 5,731,856 A | 3/1998 | Kim et al. |
| 5,744,864 A | 4/1998 | Cillessen et al. |
| 5,959,906 A | 9/1999 | Song et al. |
| 6,127,702 A | 10/2000 | Yamazaki et al. |
| 6,294,274 B1 | 9/2001 | Kawazoe et al. |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Byeong et al., "Oxide-Thin-Film-Transistor-Based Ferroelectric Memory Array," Mar. 2011, IEEE Electronic Device Letters, vol. 32 No. 3, pp. 324-326.*

(Continued)

*Primary Examiner* — Son Dinh
*Assistant Examiner* — Uyen B Tran
(74) *Attorney, Agent, or Firm* — Eric J. Robinson; Robinson Intellectual Property Law Office, P.C.

(57) ABSTRACT

A word line divider which has a simplified circuit structure and can operate stably is provided. A storage device which has a simplified circuit structure and can operate stably is provided. A transistor whose leakage current is extremely low is connected in series with a portion between a word line and a sub word line so that the word line divider is constituted. The transistor can include an oxide semiconductor for a semiconductor layer in which a channel is formed. Such a word line divider whose circuit structure is simplified is used in the storage device.

28 Claims, 15 Drawing Sheets

(56) References Cited

U.S. PATENT DOCUMENTS

| | | | |
|---|---|---|---|
| 6,366,515 B2 | 4/2002 | Hidaka | |
| 6,404,693 B1 | 6/2002 | Choi et al. | |
| 6,563,174 B2 | 5/2003 | Kawasaki et al. | |
| 6,646,946 B2 | 11/2003 | Tomishima et al. | |
| 6,727,522 B1 | 4/2004 | Kawasaki et al. | |
| 6,765,845 B2 | 7/2004 | Choi et al. | |
| 6,930,907 B2 * | 8/2005 | Sberno | G11C 7/18 365/145 |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,064,973 B2 * | 6/2006 | Peng | G11C 11/405 257/E21.66 |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,710,812 B2 | 5/2010 | Fukuda | |
| 7,732,819 B2 | 6/2010 | Akimoto et al. | |
| 8,748,879 B2 | 6/2014 | Yano et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0127038 A1 | 7/2004 | Carcia et al. | |
| 2004/0150071 A1 * | 8/2004 | Kondo | H01L 21/845 257/623 |
| 2005/0017302 A1 | 1/2005 | Hoffman | |
| 2005/0169040 A1 * | 8/2005 | Peng | G11C 11/405 365/149 |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 * | 10/2006 | Kimura | G09G 3/20 315/169.3 |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0148171 A1 | 6/2010 | Hayashi et al. | |
| 2010/0149138 A1 * | 6/2010 | Lee | G09G 3/3648 345/204 |
| 2010/0244031 A1 * | 9/2010 | Akimoto et al. | 257/57 |
| 2010/0295042 A1 * | 11/2010 | Yano | H01L 29/7869 257/43 |
| 2011/0089417 A1 | 4/2011 | Yamazaki et al. | |
| 2011/0101333 A1 | 5/2011 | Shionoiri et al. | |
| 2011/0101351 A1 | 5/2011 | Yamazaki | |
| 2011/0122670 A1 | 5/2011 | Yamazaki et al. | |
| 2011/0156028 A1 | 6/2011 | Yamazaki et al. | |
| 2011/0157961 A1 | 6/2011 | Yamazaki et al. | |
| 2011/0186837 A1 | 8/2011 | Takahashi et al. | |
| 2011/0194332 A1 | 8/2011 | Saito | |
| 2011/0260157 A1 * | 10/2011 | Yano | H01L 27/1225 257/43 |
| 2012/0026774 A1 | 2/2012 | Shionoiri | |

FOREIGN PATENT DOCUMENTS

| | | | |
|---|---|---|---|
| JP | 59-155954 A | 9/1984 | |
| JP | 60-198861 A | 10/1985 | |
| JP | 64076495 * | 9/1987 | G11C 11/34 |
| JP | 63-210022 A | 8/1988 | |
| JP | 63-210023 A | 8/1988 | |
| JP | 63-210024 A | 8/1988 | |
| JP | 63-215519 A | 9/1988 | |
| JP | 63-239117 A | 10/1988 | |
| JP | 63-265818 A | 11/1988 | |
| JP | 05-251705 A | 9/1993 | |
| JP | 07-057456 A | 3/1995 | |
| JP | 07057456 * | 3/1995 | G11C 11/401 |
| JP | 08-264794 A | 10/1996 | |
| JP | 11-505377 | 5/1999 | |
| JP | 2000-044236 A | 2/2000 | |
| JP | 2000-150900 A | 5/2000 | |
| JP | 2002-076356 A | 3/2002 | |
| JP | 2002-289859 A | 10/2002 | |
| JP | 2003-086000 A | 3/2003 | |
| JP | 2003-086808 A | 3/2003 | |
| JP | 2004-103957 A | 4/2004 | |
| JP | 2004-171744 | 6/2004 | |
| JP | 2004-234713 | 8/2004 | |
| JP | 2004-273614 A | 9/2004 | |

(56) References Cited

FOREIGN PATENT DOCUMENTS

| JP | 2004-273732 A | 9/2004 |
|---|---|---|
| TW | 200901482 | 1/2009 |
| WO | WO-2004/114391 | 12/2004 |

OTHER PUBLICATIONS

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology,", IEDM 05: Technical Digest of International Electron devices meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistor by Ar Plasma Treatment,", Appl. Phys. Lett. (Applied Physics Letters), Jun. 26, 2007, vol. 90, No. 26, pp. 262106-1-262106-3

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the In2O3—Ga2ZnO4—ZnO system at 1350° C,", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m =7, 8, 9, and 16) in the In2O3—ZnGa2O4—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3-ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsude.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits, 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTs,", IDW '09 : Proceedings of the 16th International Display Workshops, 2009, pp. 689-692.

Park.J et al., "Amorphous Indium—Gallium—Zinc Oxide TFTs and Their Application for Large Size AMOLED,", AM-FPD '08 Digest of Technical Papers, Jul. 2, 2008, pp. 275-278.

Park.S et al. "Challenge to Future Displays: Transparent AM-OLED Driven by Peald Grown ZnO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDS,", Journal of the SID, 2007, vol. 15, No. 1, pp. 17-22.

(56) References Cited

OTHER PUBLICATIONS

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTs With a Novel Passivation Layer,", SID Digest '09 : SID International Symposium Digest of Technical Papers, May 31, 2009, pp. 284-287.

Miyasaka.M, "SUFTLA Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1: Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymers-Stabilized Liquid Crystal Blue Phases,", Nature Materials, Sep. 2, 2002, vol. 1, pp. 64-68.

Kimizuka.N et al., "Spinel, YbFe2O4, and Yb2Fe3O7 Types of Structures for Compounds in the In2O3 and Sc2O3—A2O3—Bo Systems [A; Fe, Ga, Or, Al; B: Mg, Mn, Fe, Ni, Cu,Or Zn] at Temperatures over 1000° C,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B(Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters), Sep. 1, 2003, vol. 83, No. 9, pp. 1755-1757.

Ishii et al., "A Poly-Silicon TFT With a Sub-5-nm Thick Channel for Low-Power Gain Cell Memory in Mobile Applications," IEEE Transactions on Electron Devices, Nov. 1, 2004, vol. 51, No. 11, pp. 1805-1810.

Kim et al., "An Experimental High-Density DRAM Cell with a Built-in Gain Stage," IEEE Journal of Solid-State Circuits, Aug. 1, 1994, vol. 29, No. 8, pp. 978-981.

Shukuri et al., "A Complementary Gain Cell Technology for Sub-1V Supply DRAMs," IEDM 92: Technical Digest of International Electron Devices Meeting, Dec. 13, 1992, pp. 1006-1008.

Shukuri, "A Semi-Static Complementary Gain Cell Technology for Sub-1 V Supply DRAM's," IEEE Transactions on Electron Devices, Jun. 1, 1994, vol. 41, No. 6, pp. 926-931.

Taiwanese Official Action (Application No. 101117387) Dated Jun. 21, 2016.

Taiwanese Office Action (Application No. 101117387) Dated Apr. 20, 2017.

* cited by examiner

- In
- Sn
- Zn
- O

● In
○ Ga
○ Zn
● O

WORD LINE DIVIDER AND STORAGE DEVICE

BACKGROUND OF THE INVENTION

1. Field of the Invention

The present invention relates to storage devices including semiconductor elements. In particular, the present invention relates to storage devices to which data is written and from which data is read using selection transistors.

2. Description of the Related Art

A method for writing data to and reading data from a storage device including a semiconductor element with the use of selection transistors provided in memory cells is known. Typical examples of storage devices including selection transistors are dynamic random access memories (DRAMs) and static random access memories (SRAMs).

In the case of a storage device including a plurality of memory cells, a word line and a bit line are connected to selection transistors provided in the memory cells, and the memory cells can be selected or non-selected by a signal input to the word line.

Here, all the plurality of memory cells that are connected to one word line are transferred to a selected state when the word line is selected; thus, it is necessary to perform processing on the bit lines connected to all the plurality of memory cells. Consequently, as the number of memory cells (also referred to as the number of bits) increases, the cycle time required for random access increases. In order to solve such a problem, a method for dividing one word line with the use of a logic circuit has been devised (Patent Document 1). A method for dividing one word line with the use of a transistor has also been devised (Patent Document 2).

REFERENCE

Patent Document 1: Japanese Published Patent Application No. 2004-171744.
Patent Document 2: Japanese Published Patent Application No. 2004-234713.

SUMMARY OF THE INVENTION

In the conventional method for dividing a word line that is disclosed in Patent Document 1, it is necessary to connect CMOS logic circuits to divided word lines (hereinafter also referred to as sub word lines) connected to word lines. For example, in the case where AND circuits are connected to the sub word lines, it is necessary to provide a circuit including four to six transistors per sub word line.

In particular, as the integration degree of a memory cell becomes significantly high by a reduction in cell size (typically a recent DRAM or the like), large circuits connected to sub word lines impede high integration.

With the method for dividing a word line that is disclosed in Patent Document 2, operation might be unstable. In other words, the potential of a sub word line (corresponding to a sub word line in Patent Document 2) is gradually changed due to leakage current of a transistor connected to a word line (corresponding to a main word line in Patent Document 2) and the sub word line, so that a memory cell connected to the sub word line is selected. In particular, a DRAM loses data retained when a memory cell is unintentionally selected.

The present invention is made in view of the technical background. Thus, it is an object of the present invention to provide a word line divider which has a simplified circuit structure and can operate stably. It is an object of the present invention to provide a storage device which has a simplified circuit structure and can operate stably.

One embodiment of the present invention solves at least one of the above problems.

A word line divider according to one embodiment of the present invention includes a word line, a plurality of sub word lines, and a plurality of transistors. One of a source and a drain of each of the transistors is electrically connected to the word line. The other of the source and the drain of each of the transistors is electrically connected to one of the sub word lines. Off-state leakage current per micrometer of channel width is $1 \times 10^{-17}$ A or lower.

In the word line divider according to one embodiment of the present invention, a transistor whose leakage current is extremely low is electrically connected between the word line and the sub word line. Thus, when the transistor is on, a signal input to the word line is input to the sub word line. In contrast, when the transistor is off, the sub word line remains non-selected regardless of a signal input to the word line.

Here, for example, in the case where the transistor includes silicon for a semiconductor layer in which a channel is formed, the potential of the sub word line is gradually changed due to leakage current of the transistor even when the transistor is kept off. Accordingly, a memory cell connected to the sub word line might be selected. Thus, it is impossible to obtain such a word line divider which has a simplified circuit structure and can operate stably. When a transistor whose leakage current is extremely low is used, it is possible to obtain such a word line divider which has a greatly simplified circuit structure and can operate stably.

Further, in one embodiment of the present invention, in the word line divider, the transistor includes an oxide semiconductor for the semiconductor layer in which a channel is formed.

As the transistor, it is particularly preferable to use a field-effect transistor including an oxide semiconductor whose bandgap is wider than that of silicon for a semiconductor layer in which a channel is formed. Such a transistor has low off-state leakage current.

Further, an oxide semiconductor, which has extremely low intrinsic carrier density, is preferably used as the semiconductor included in the transistor. The intrinsic carrier density of the semiconductor layer in which a channel is formed is extremely low, so that the off-state leakage current of the transistor is extremely low. This feature is unique to an oxide semiconductor that other semiconductors (e.g., silicon) do not have.

A storage device according to one embodiment of the present invention includes a bit line, a word line, a plurality of sub word lines, a plurality of transistors, and a plurality of memory cells. Each of the memory cells includes a data retention portion and a selection transistor. One of a source and a drain of the selection transistor is electrically connected to the bit line. The other of the source and the drain of the selection transistor is electrically connected to the data retention portion. A gate of the selection transistor is electrically connected to one of the sub word lines. One of a source and a drain of each of the transistors is electrically connected to the word line. The other of the source and the drain of each of the transistors is electrically connected to one of the sub word lines. Off-state leakage current per micrometer of channel width is $1 \times 10^{-17}$ A or lower.

The circuit structure of a storage device according to one embodiment of the present invention that has such a word line divider which has a simplified structure and can operate stably can be simplified; thus, the storage device can have a smaller circuit area and can be suitable for high integration.

The storage device according to one embodiment of the present invention can have either a DRAM memory cell or an SRAM memory cell.

Thus, as compared to a conventional DRAM or SRAM, an increase in circuit area can be inhibited and a divided word line can be stably used.

A transistor whose off-state leakage current per micrometer of channel width is $1\times10^{-17}$ A or lower can be used as the selection transistor in the storage device according to one embodiment of the present invention.

With the use of such a transistor whose leakage current is extremely low as the selection transistor, data retained in the data retention portion can be prevented from being lost through the selection transistor, so that a storage device having an extremely long data retention period, that is, a substantially nonvolatile storage device can be obtained. In particular, with the use of the transistor whose leakage current is extremely low as a selection transistor of a DRAM, the storage device can be used as a storage device whose refresh frequency is greatly reduced or a storage device which does not need refresh operation.

Further, in one embodiment of the present invention, in the storage device, the transistor includes an oxide semiconductor for the semiconductor layer in which a channel is formed.

The circuit structure of a storage device according to one embodiment of the present invention that has such a word line divider can be simplified; thus, the storage device can have a smaller circuit area and can be suitable for high integration. Further, as a transistor included in the word line divider, it is preferable to use a transistor which includes an oxide semiconductor in a semiconductor layer in which a channel is formed.

Note that in this specification and the like, a word line is one of selection signal lines that is electrically connected to a gate of a selection transistor in a cell to be connected and selects the cell to be connected. In a storage device, the cell is a memory cell having a data retention portion.

In this specification and the like, a bit line is one of signal lines to which a signal input to a cell to be connected or a signal output from the cell is input. In a storage device, the cell is a memory cell having a data retention portion, and either one or both a signal for reading data from the memory cell and a signal for writing data to the memory cell are input to the bit line.

Note that in this specification and the like, a word line divider is a circuit capable of controlling the selection states of a plurality of sub word lines connected to a word line. Here, the word line divider includes at least one switching element (including a transistor). In its broad sense, components of the word line divider include a word line and a plurality of sub word lines.

Note that a word line divider according to one embodiment of the present invention is not limited to a storage device. The word line divider according to one embodiment of the present invention can be used in a variety of circuits including word lines, and a divided word line can be stably controlled with a simplified structure. Different examples of circuits including word lines are display devices such as liquid crystal display devices, electroluminescent display devices (display devices including organic electroluminescence (EL) elements or light-emitting diodes (LEDs)), and field emission displays (FEDs).

According to one embodiment of the present invention, it is possible to provide a word line divider which has a simplified circuit structure and can operate stably. Further, it is possible to provide a storage device which has a simplified circuit structure and can operate stably.

DETAILED DESCRIPTION OF THE INVENTION

Figure 1:
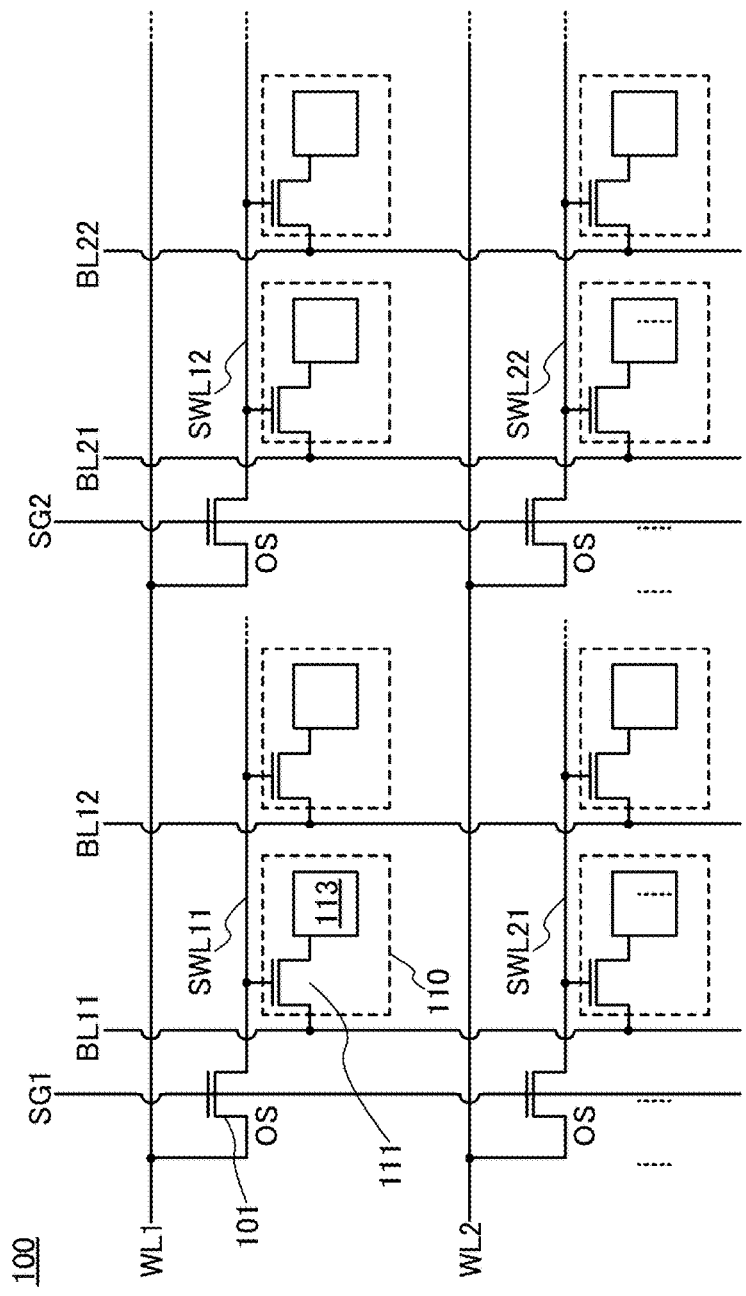
FIG. 1 illustrates a storage device according to one embodiment of the present invention.

Embodiments will be described in detail with reference to the drawings. Note that the present invention is not limited to the following description. It will be readily appreciated by those skilled in the art that modes and details of the present invention can be modified in various ways without departing from the spirit and scope of the present invention. The present invention therefore should not be construed as being limited to the following description of the embodiments. Note that in structures of the present invention described below, the same portions or portions having similar functions are denoted by the same reference numerals in different drawings, and a description thereof is not repeated.

Note that in each drawing described in this specification, the size, the layer thickness, or the region of each component is exaggerated for clarity in some cases. Thus, embodiments of the present invention are not limited to such scales.

A transistor is a kind of semiconductor elements and can perform amplification of current or voltage, switching operation for controlling conduction or non-conduction, or the like. A transistor in this specification includes an insulated-gate field-effect transistor (IGFET) and a thin film transistor (TFT).

The functions of a "source" and a "drain" might interchange when a transistor of opposite polarity is used or the direction of current flow is changed in circuit operation, for example. Thus, in this specification, the terms "source" and "drain" can interchange.

In this specification and the like, one of a source and a drain of a transistor is referred to as a "first electrode" and the other of the source and the drain of the transistor is referred to as a "second electrode" in some cases. Note that in that case, a gate is also referred to as a "gate" or a "gate electrode".

In this specification and the like, an expression "electrically connected" means that components are connected to each other through an object having any electric action. Here, there is no particular limitation on an object having any electric action as long as electric signals can be transmitted and received between components that are connected to each other through the object. Examples of an object having any electric action include an electrode, a wiring, a switching element such as a transistor, a resistor, a coil, a capacitor, and an element with a variety of functions.

Note that in this specification and the like, a node is an element (e.g., a wiring) which enables electrical connection between elements included in a circuit. Thus, a "node to which A is connected" is a wiring which is electrically connected to A and can be regarded as having the same potential as A. Even when one or more elements which enable electrical connection (e.g., switches, transistors, capacitors, inductors, resistors, or diodes) are inserted in a portion of the wiring, the wiring can be regarded as the "node to which A is connected" as long as it has the same potential as A.

Note that in some circuit diagrams described in this specification, "OS" is written beside a transistor in order to indicate that the transistor includes an oxide semiconductor or the like and has low off-state current.

Embodiment 1

In this embodiment, structure examples of a word line divider according to one embodiment of the present invention and a storage device including the word line divider are described with reference to FIG. 1, FIG. 2, and FIG. 3.

Structure Example

Figure 2:
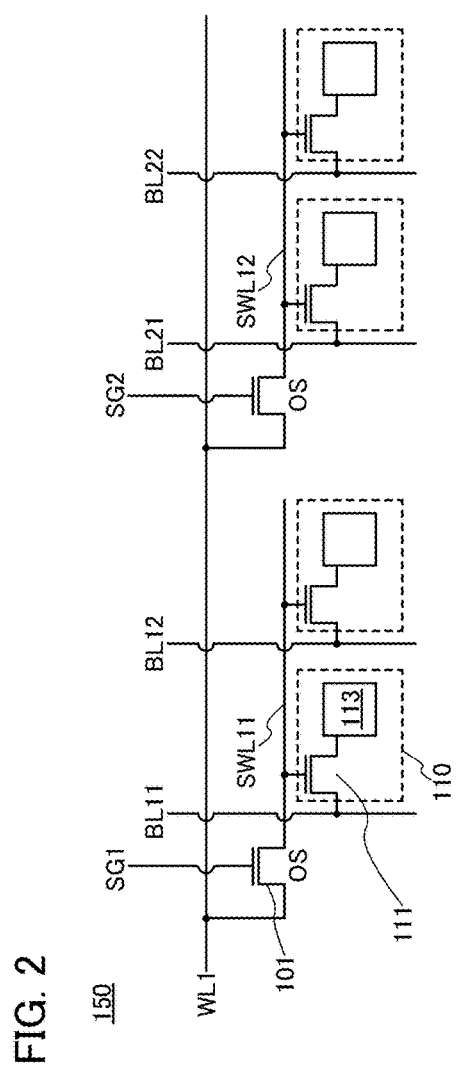
FIG. 2 illustrates a storage device according to one embodiment of the present invention.

A storage device 100 illustrated in FIG. 1 includes a plurality of memory cells arranged in a matrix of m rows by (n×l) columns (m and l are each an integer of 1 or more and n is an integer of 2 or more). Note that for clarity, FIG. 1 illustrates a structure where m, n, and l are each 2.

The storage device 100 includes m word lines WLm, n selection signal lines SGn, (n×l) bit lines BLnl, (m×n) sub word lines SWLmn, and a plurality of memory cells 110 that are connected to the sub word lines SWLmn and the bit lines BLnl.

The memory cell 110 includes at least one selection transistor 111 and a data retention portion 113. A gate of the selection transistor 111 is connected to one of the sub word lines SWLmn. A first electrode of the selection transistor 111 is connected to one of the bit lines BLnl. A second electrode of the selection transistor 111 is connected to the data retention portion 113.

The data retention portion 113 has a function of retaining data input through the selection transistor 111. Further, the data retention portion 113 can output data through the selection transistor 111. Specific structure examples of the data retention portion 113 and the memory cell 110 will be described in the following embodiment.

The sub word lines SWLmn are connected to the word lines WLm through the transistors 101. First electrodes of the transistors 101 are connected to the word lines WLm. Second electrodes of the transistors 101 are connected to the sub word lines SWLmn. Gates of the transistors 101 are connected to the selection signal lines SGn.

Here, in this embodiment, the transistor 101 and the selection transistor 111 are n-channel transistors.

Here, a transistor whose off-state leakage current (also referred to as off-state current) is low is used as the transistor 101. The required value of off-state current of the transistor 101 depends on the value of parasitic capacitance between a sub word line to be connected and a plurality of memory cells connected to the sub word line, the selection time of the sub word line, and the like. The off-state current of the transistor 101 is preferably as low as possible because a change in potential of the sub word line in a non-selected state can be reduced. For example, the off-state current of the transistor 101 may be 10 aA ($1\times10^{-17}$ A) or lower per micrometer of channel width. Note that in general, in the case where silicon is used for a semiconductor layer in which a channel is formed, off-state current is approximately several picoamperes ($1\times10^{-12}$ A) to several nanoamperes ($1\times10^{-9}$ A) per micrometer of channel width.

As such a transistor whose off-state current is low, for example, it is possible to use a transistor including a semiconductor whose bandgap is wider than that of silicon in a semiconductor layer in which a channel is formed. For example, a semiconductor whose bandgap is 2 eV or more, preferably 2.5 eV or more, more preferably 3.0 eV or more can be used. An oxide semiconductor is preferably used as such a semiconductor.

Off-state leakage current per micrometer of channel width of the transistor including an oxide semiconductor is 10 aA ($1\times10^{-17}$ A) or lower, preferably 1 aA ($1\times10^{-18}$ A) or lower, more preferably 10 zA ($1\times10^{-20}$ A) or lower, still more preferably 1 zA ($1\times10^{-21}$ A) or lower, much more preferably 100 yA ($1\times10^{-22}$ A) or lower.

Conduction or non-conduction between the sub word line connected to one of the transistors 101 and the word line is controlled by turning on or off the transistor 101. The word line and the sub word line are brought into conduction when the transistor 101 is on, whereas the word line and the sub word line are brought out of conduction when the transistor 101 is off. Since the leakage current of the transistor 101 is extremely low, a change in potential of the sub word line due to a potential input to the word line is greatly reduced when the transistor 101 is off, that is, when the sub word line is in a non-conductive state.

With the use of such a transistor whose leakage current is extremely low, a word line divider which has a greatly simplified structure and can operate stably can be obtained. In this embodiment, the word lines WLm, the plurality of sub word lines SWLmn connected to the word lines WLm, and the plurality of transistors connected in series with the word lines WLm and the plurality of sub word lines SWLmn correspond to the word line divider.

Example of Circuit Operation

Next, an operation example of the storage device is described. For simplicity, the operation of a storage device 150 including four memory cells arranged in one row by four columns as illustrated in FIG. 2 is described. The storage device 150 corresponds to the storage device 100, where m, n, and l are 1, 2, and 2, respectively.

Figure 3:
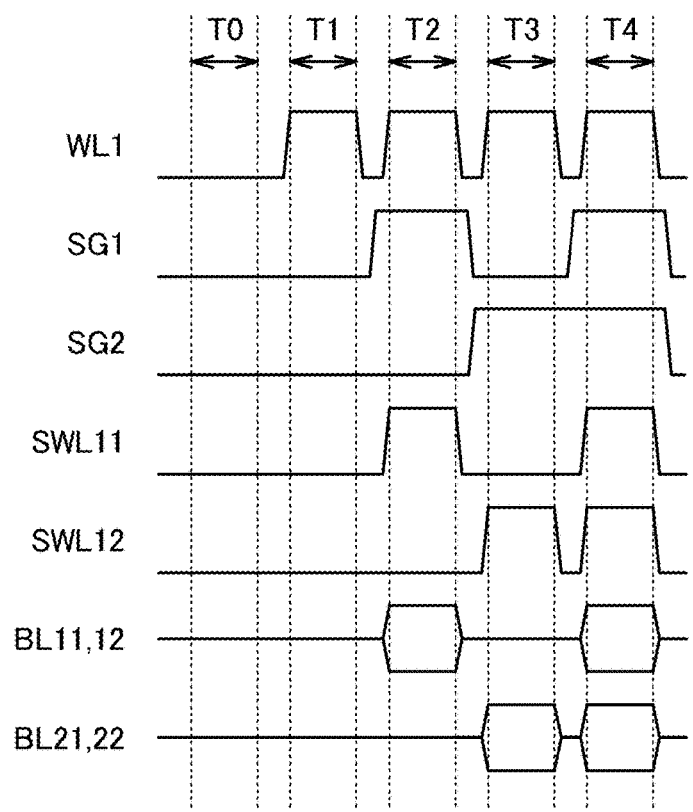
FIG. 3 is a timing chart illustrating the operation of the storage device according to one embodiment of the present invention.

FIG. 3 is an example of a timing chart illustrating the operation of the storage device 150. FIG. 3 schematically illustrates time transition of, from the top, a word line WL1, a selection signal line SG1, a selection signal line SG2, a sub word line SWL11, a sub word line SWL12, bit lines BL11 and BL12, and bit lines BL21 and BL22 that are illustrated in FIG. 2.

Note that the word line WL1, the selection signal line SG1, and the selection signal line SG2 are selected when high-level potentials are input to these lines, and the word line WL1, the selection signal line SG1, and the selection signal line SG2 are non-selected when low-level potentials are input to these lines. Further, the transistor 101 and the selection transistor 111 are turned on when high-level potentials are input to the gates of these transistors, and the transistor 101 and the selection transistor 111 are turned off when low-level potentials are input to the gates of these transistors.

Writing of data to the data retention portions 113 in the memory cells is described below.

In a period T0, the word line WL1 is non-selected. At this time, the selection signal lines SG1 and SG2 are also non-selected.

In a period T1, the word line WL1 is selected and the selection signal lines SG1 and SG2 are non-selected. At this time, the off-state current of the transistors 101 that are connected to the selection signal lines SG1 and SG2 is extremely low, so that the potentials of the sub word lines SWL11 and SWL12 are not changed.

In a period T2, the word line WL1 and the selection signal line SG1 are selected. Thus, the potential of the word line WL1 is input to the sub word line SWL11, and the plurality of memory cells 110 connected to the sub word line SWL11 are selected. On the other hand, the selection signal line SG2 is non-selected and the off-state current of the transistor 101 that is connected to the selection signal line SG2 is extremely low, so that the potential of the sub word line SWL12 is kept low.

Here, data to be written to the memory cells 110 that are connected to the bit lines BL11 and BL12 are input to the bit lines BL11 and BL12. In other words, either a high-level potential or a low-level potential is input to the bit lines BL11 and BL12. At this time, the selection transistors 111 in the memory cells 110 that are connected to the bit lines BL11 and BL12 are on, so that the potential of the bit line BL11 or BL12 is input to the data retention portion 113 through the selection transistor 111. In this manner, data can be written to the memory cells 110 that are connected to the sub word line SWL11.

In a period T3, the word line WL1 and the selection signal line SG2 are selected. Thus, the potential of the word line WL1 is input to the sub word line SWL12, and the plurality of memory cells 110 connected to the sub word line SWL12 are selected. On the other hand, the selection signal line SG1 is non-selected and the off-state current of the transistor 101 that is connected to the selection signal line SG1 is extremely low, so that the potential of the sub word line SWL11 is kept low.

Here, data to be written to the memory cells 110 that are connected to the bit lines BL21 and BL22 are input to the bit lines BL21 and BL22. In other words, either a high-level potential or a low-level potential is input to the bit lines BL21 and BL22. At this time, the selection transistors 111 in the memory cells 110 that are connected to the bit lines BL21 and BL22 are on, so that the potential of the bit line BL21 or BL22 is input to the data retention portion 113 through the selection transistor 111. In this manner, data can be written to the memory cells 110 that are connected to the sub word line SWL12.

In a period T4, the word line WL1 and the selection signal lines SG1 and SG2 are selected. Thus, the potential of the word line WL1 is concurrently input to the sub word lines SWL11 and SWL12, and the plurality of memory cells 110 connected to the sub word lines SWL11 and SWL12 are selected.

As in the above case, data to be written to the memory cells 110 that are connected to the bit lines BL11, BL12, BL21, and BL22 are input to the bit lines BL11, BL12, BL21, and BL22, and the data is written to the data retention portions 113 in the memory cells 110 through the selection transistors 111.

Note that although the writing of data to the memory cells 110 is described, read operation can be similarly performed. In the case of the read operation, potentials based on data retained in the data retention portions 113 in the memory cells 110 are output to the bit lines BL11, BL12, BL21, and BL22. Thus, in the case of the read operation, the waveforms (input potentials) of the bit lines BL11, BL12, BL21, and BL22 in the timing chart in FIG. 3 can be replaced with output potentials.

Note that although data to be written to the data retention portion 113 is two kinds of potentials (a high-level potential and a low-level potential) here, plural kinds (three or more kinds) of potentials can be retained depending on the structure of the data retention portion 113. For example, when four kinds of potentials can be retained, 2-bit data can be retained in one memory cell.

The above is the description of the storage device 150.

In this manner, when a transistor whose leakage current is extremely low is used in a word line divider according to one embodiment of the present invention, a divided word line can be stably used with the use of only one transistor. Such a simplified word line divider does not impede its integration. Thus, by application of the word line divider to a storage device, a highly integrated storage device can be obtained.

This embodiment can be combined with any of the other embodiments disclosed in this specification as appropriate.

Embodiment 2

In this embodiment, more specific structure examples of the storage device illustrated in Embodiment 1 are described with reference to FIG. 4, FIG. 5, FIG. 6, and FIG. 7.

Note that a description that overlaps with the description of the portions in Embodiment 1 is omitted or simply given.

Structure Example 1

Figure 4:
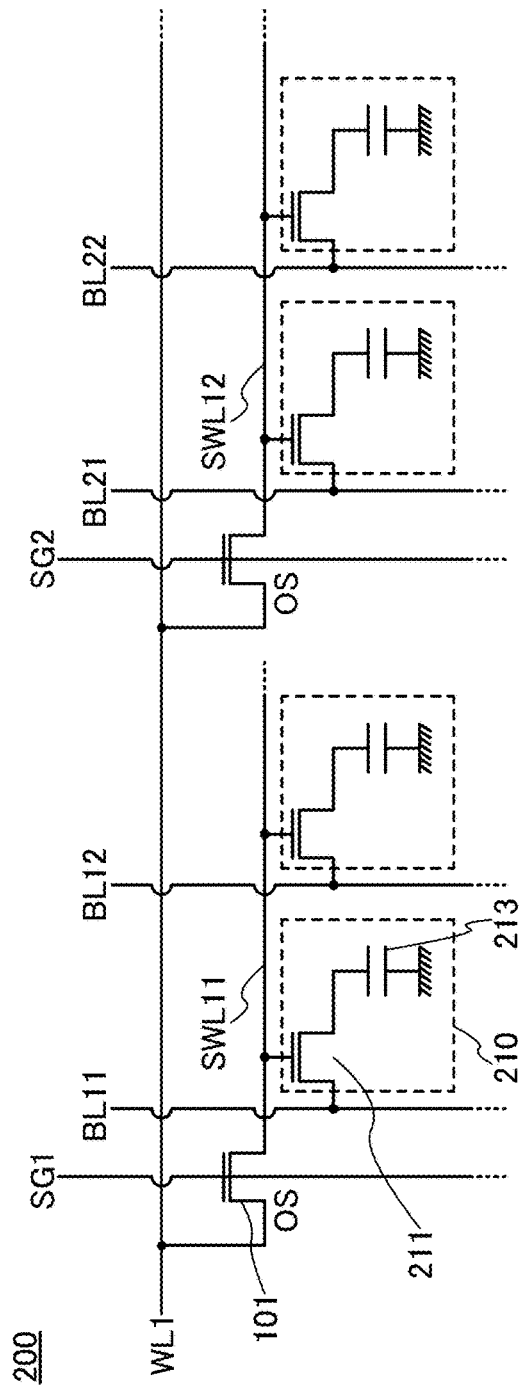
FIG. 4 illustrates a storage device according to one embodiment of the present invention.

FIG. 4 is an example in which a DRAM memory cell is used as the memory cell 110 in the storage device 100 illustrated in Embodiment 1.

A storage device 200 illustrated in FIG. 4 includes a plurality of memory cells 210. Note that the structure of the storage device 200 is similar to the structure of the storage device 100 except for the memory cells.

The memory cell 210 includes a selection transistor 211 and a capacitor 213. A second electrode of the selection transistor 211 is connected to one electrode of the capacitor 213. A common potential is applied to the other electrode of the capacitor 213. In this structure example, the selection transistor 211 is an n-channel transistor. Here, instead of the common potential, a reference potential or a ground potential may be used. Further, a potential between two kinds of potentials input to a bit line is preferably used as the reference potential because voltage applied to the capacitor 213 can be reduced and dielectric breakdown of the capacitor 213 can be inhibited.

Data can be written to the memory cell 210 in such a manner that the selection transistor 211 is turned on, write data is input to a bit line to which the selection transistor 211 is connected, and electric charge is accumulated in the capacitor 213 through the selection transistor 211.

The data retained in the memory cell 210 can be read in such a manner that the potential of the bit line to which the selection transistor 211 is connected is changed depending on the electric charge held in the capacitor 213 by turning on the selection transistor 211 and a change in the potential is detected. Note that after the data retained in the memory cell 210 is read, the data is lost.

Here, as illustrated in the following embodiment, the transistor 101 can be stacked over the selection transistor 211 and the capacitor 213. Thus, even when the memory cell 210 is highly integrated, a word line divider including the transistor 101 can be connected to the storage device without an increase in area.

A word line divider according to one embodiment of the present invention that includes only one transistor as described above can be applied to a DRAM. Such a simplified word line divider does not impede its integration. Thus, by application of the word line divider to a DRAM, a highly integrated DRAM can be obtained.

Modification Example

Here, in the storage device 200 illustrated in Structure Example 1, the transistor whose leakage current is extremely low in the above embodiment can be used as the selection transistor 211 in the memory cell 210.

Figure 5:
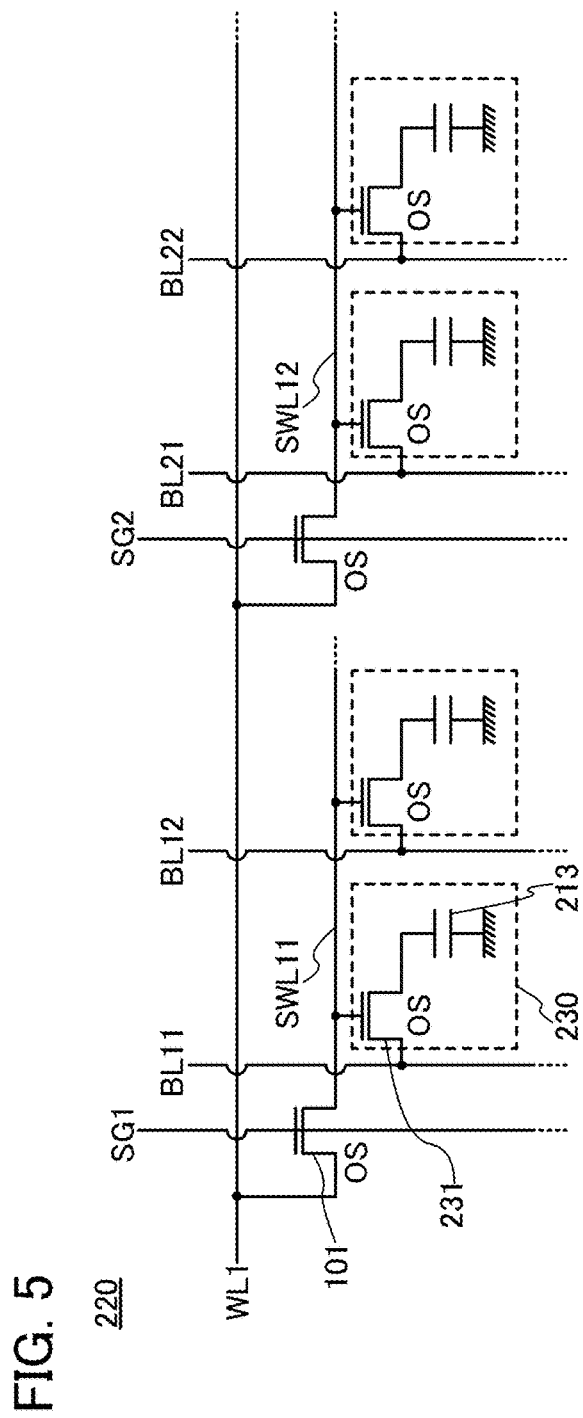
FIG. 5 illustrates a storage device according to one embodiment of the present invention.

A storage device 220 illustrated in FIG. 5 is obtained by replacement of the memory cell 210 in the storage device 200 illustrated in Structure Example 1 with a memory cell 230 including a selection transistor 231 whose leakage current is extremely low.

Since the leakage current of the selection transistor 231 is extremely low, electric charge held in the capacitor 213, that is, data written to the memory cell 230 can be retained for an extremely long time. Thus, it is possible not to perform data rewrite operation (refresh operation) or it is possible to greatly reduce the frequency of data rewrite operation (refresh operation). Consequently, the storage device 220 can be a storage device which consumes much less power than a conventional DRAM.

Further, since the leakage current of the selection transistor 231 is extremely low, the capacitor 213 for holding electric charge can be made small. Alternatively, it is possible not to provide the capacitor 213 and it is possible to use parasitic capacitance or the like between wirings as a storage capacitor. Thus, the memory cell can be made small.

Structure Example 2

Figure 6:
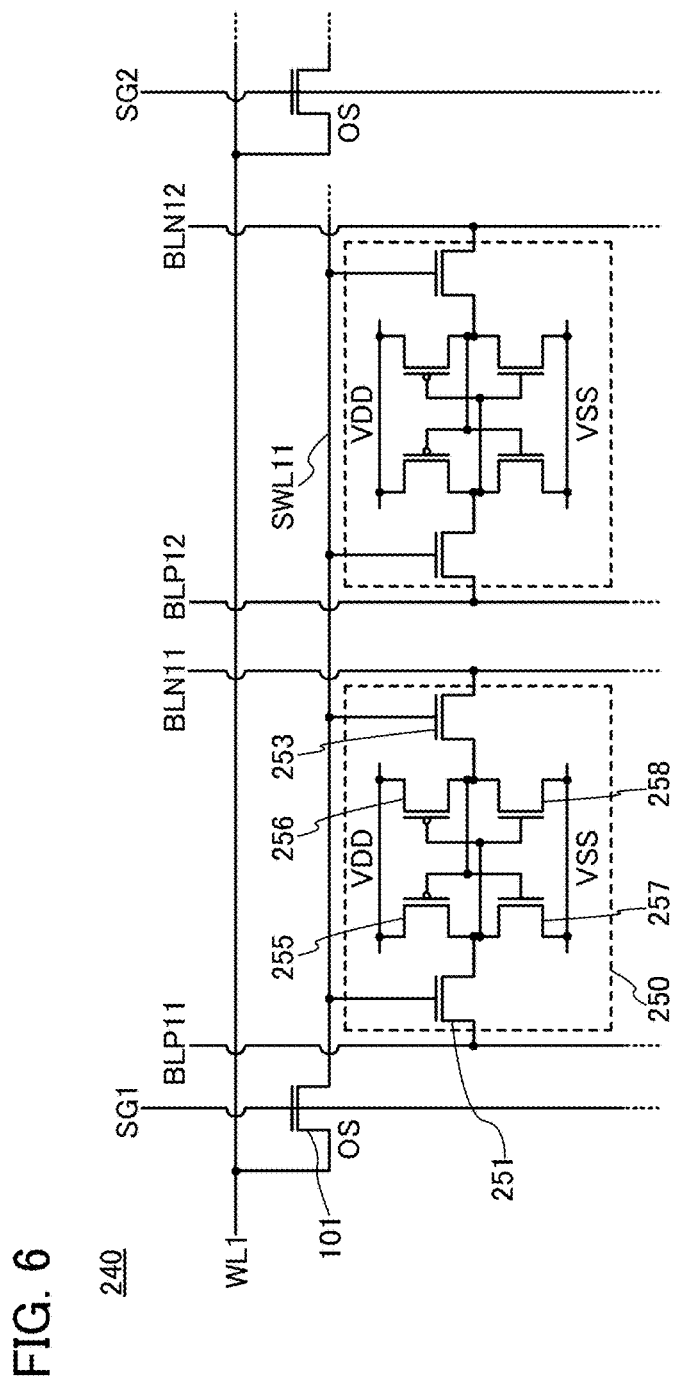
FIG. 6 illustrates a storage device according to one embodiment of the present invention.

FIG. 6 is an example in which an SRAM memory cell is used as the memory cell 110 in the storage device 100 illustrated in Embodiment 1.

The structure of a storage device 240 illustrated in FIG. 6 is the same as that of the storage device 100 illustrated in Embodiment 1 except that the structure of the memory cell is different and that two bit lines are connected to each memory cell.

The sub word lines SWLmn, first bit lines BLPnl, and second bit lines BLNnl are connected to memory cells 250. Here, inverted signals are input to or output from the first bit lines BLPnl and the second bit lines BLNnl.

The memory cell 250 includes six transistors: selection transistors 251 and 253 and transistors 255 to 258. Here, the transistors 255 and 256 are p-channel transistors, and the transistors 257 and 258 are n-channel transistors.

Here, a power supply potential VDD is input to first electrodes of the transistors 255 and 256, and a reference potential VSS is input to second electrodes of the transistors 257 and 258. The transistors 255 and 257 constitute an inverter, and the transistors 256 and 258 constitute an inverter. A flip-flop is constituted of a combination of these two inverters.

A first electrode of the selection transistor 251 is connected to the first bit line, and a second electrode of the selection transistor 251 is connected to one input-output portion of the flip-flop. Further, a first electrode of the selection transistor 253 is connected to the other input-output portion of the flip-flop, and a second electrode of the selection transistor 253 is connected to the second bit line. Gates of the selection transistors 251 and 253 are connected to the sub word line.

Data is written to the memory cell 250 in such a manner that the selection transistors 251 and 253 are turned on by selecting the sub word line, and inverted write data is input to the first bit line and the second bit line. At this time, the data is retained in the flip-flop in the memory cell 250 through the selection transistors 251 and 253.

Similarly, the data retained in the memory cell 250 can be read in such a manner that the selection transistors 251 and 253 are turned on by selecting the sub word line, inverted data is output to the first bit line and the second bit line, the potentials of the first bit line and the second bit line are changed, and changes in these potentials are detected.

A word line divider according to one embodiment of the present invention that includes only one transistor as described above can be applied to an SRAM. An SRAM including such a simplified word line divider can have a small circuit area.

Structure Example 3

In this structure example, a storage device which is different from the storage device in the above structure example is described.

Figure 7:
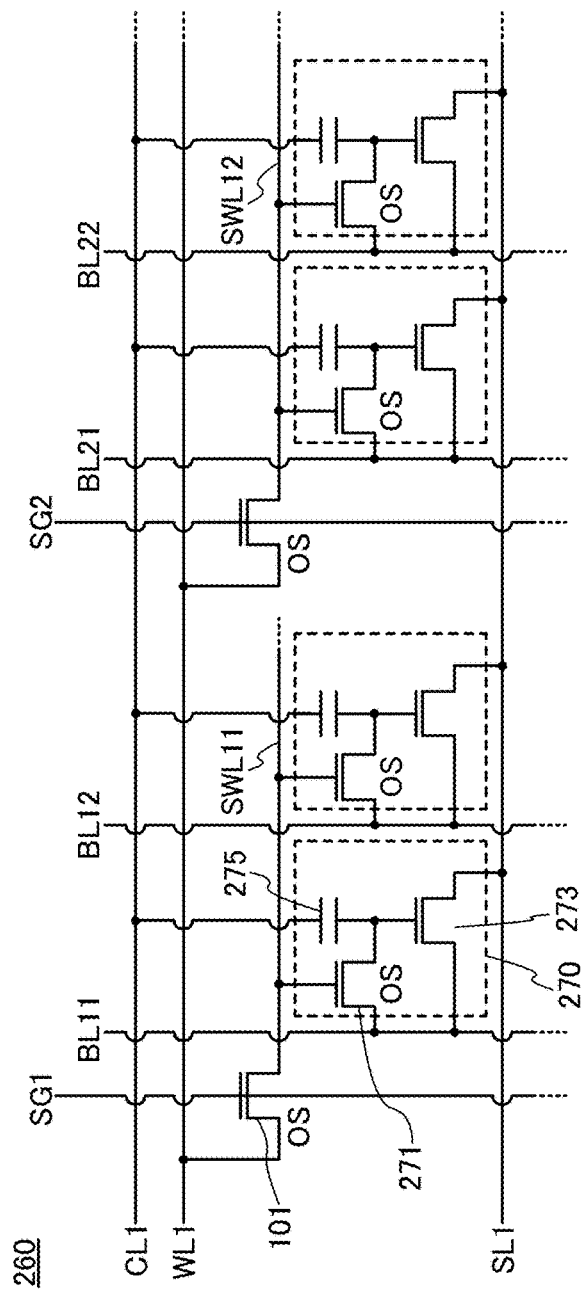
FIG. 7 illustrates a storage device according to one embodiment of the present invention.

The structure of a storage device 260 in FIG. 7 is similar to that of the storage device 100 illustrated in Embodiment 1 except that the structure of a memory cell is different and that m capacitor lines CLm and m source lines SLm are provided.

A memory cell 270 includes a selection transistor 271 whose leakage current is extremely low, a transistor 273, and a capacitor 275. In this structure example, the selection transistor 271 and the transistor 273 are n-channel transistors.

A gate of the selection transistor 271 is connected to the sub word line. A first electrode of the selection transistor 271 is connected to the bit line. A second electrode of the selection transistor 271 is connected to a gate of the transistor 273 and one electrode of the capacitor 275. A first electrode of the transistor 273 is connected to the bit line. A second electrode of the transistor 273 is connected to the source line. The other electrode of the capacitor 275 is connected to the capacitor line. Here, data can be stored in such a manner that a potential is held in a node (hereinafter also referred to as a holding node) connected to the second electrode of the selection transistor 271, one electrode of the capacitor 275, and the gate of the transistor 273.

Data can be written to the memory cell 270 in such a manner that the selection transistor 271 is turned on by selecting the sub word line, write data is input to the bit line, and electric charge is accumulated in the capacitor 275 through the selection transistor 271.

The data is read from all the memory cells that are connected to one capacitor line. All the sub word lines are non-selected, a high-level potential is applied to a source line to which the memory cell 270 from which data is read is connected, and a negative potential is applied to all the capacitor lines except for a capacitor line to which the memory cell 270 from which data is read is connected. Here, the negative potential applied to the capacitor lines is input to the gates of the transistors 273 through the capacitors 275 by capacitive coupling regardless of the potential held in the holding node, and turns off the transistor 273. Thus, all the transistors 273 in the memory cells 270 from which data is not read are turned off.

At this time, the transistor 273 is turned on when a high-level potential is held in the holding node of the memory cell 270 from which data is read; thus, a high-level potential applied to the source line is output to the bit line through the transistor 273. In contrast, the transistor 273 is kept off when a low-level potential is held in the holding node; thus, the potential of the bit line is not changed. Consequently, the data retained in the memory cell 270 can be read by detecting whether the potential of the bit line is changed.

Here, a transistor whose leakage current is extremely low is used as the selection transistor 271. Thus, release of electric charge held in the holding node through the selection transistor 271 can be greatly inhibited. Accordingly, a data retention period can be greatly increased. The storage device 260 including the selection transistor whose leakage current is extremely low can be used as a substantially nonvolatile storage device.

Note that although an n-channel transistor is used as the transistor 273 in this structure example, a p-channel transistor may be used. In that case, a simplified storage device which does not use a negative potential can be constituted, which is preferable.

Further, although one source line is provided in each row in this structure example, a source line may be used in common among a plurality of rows. Furthermore, a source line may be provided in a column direction or may be used in common among a plurality of columns.

A word line divider according to one embodiment of the present invention that includes only one transistor as described above can be applied to a nonvolatile storage device including a selection transistor. A storage device which can operate stably and has a small circuit area can be obtained with the use of such a simplified word line divider that can operate stably.

This embodiment can be combined with any of the other embodiments disclosed in this specification as appropriate.

Embodiment 3

In this embodiment, a structure example of a storage device including a word line divider according to one embodiment of the present invention is described with reference to FIG. 8.

Figure 8:
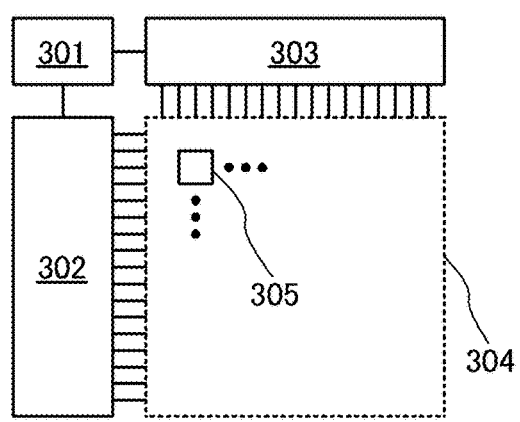
FIG. 8 illustrates a storage device according to one embodiment of the present invention.

FIG. 8 is a block diagram illustrating a structure example of a storage device 300 in this embodiment.

The storage device 300 includes a control circuit 301, a driver circuit 302, a driver circuit 303, and a memory cell array 304.

A write control signal, a read control signal, and an address signal are input to the control circuit 301. The control circuit 301 has functions of generating and outputting a plurality of control signals in response to the signals input. For example, the control circuit 301 outputs a row address signal and a column address signal in response to the address signal input.

A row address signal is input to the driver circuit 302. The driver circuit 302 has functions of selecting a wiring (e.g., the word line, the capacitor line, the source line, or the like in the above embodiment) provided in a row direction in response to the row address signal input and setting the voltage of the wiring selected. The driver circuit 302 includes a first decoder, for example. The first decoder has a function of selecting a wiring provided in the row direction in response to the row address signal input.

A data signal and a column address signal are input to the driver circuit 303. The driver circuit 303 has functions of selecting a wiring (e.g., the bit line, the selection signal line, or the like in the above embodiment) provided in a column direction and setting the voltage of the wiring selected. The driver circuit 303 includes a second decoder and a plurality of analog switches, for example. The second decoder has a function of selecting a wiring provided in the column direction, and the plurality of analog switches have a function of controlling whether the data signal is output in response to a signal input from the second decoder. Note that the driver circuit 303 may include a read circuit. The read circuit has a function of reading data stored in a memory cell 305 that is connected to a wiring selected.

The memory cell array 304 includes the memory cells 305 arranged in matrix. The structure of the memory cell in the above embodiment can be used as the structure of the memory cell 305. The memory cell 305 is selected by the driver circuit 302 and the driver circuit 303, and data is written to or read from the selected memory cell 305.

In the storage device 300 illustrated in FIG. 8, the memory cell is selected by the driver circuits in response to a signal input to the control circuit, and write operation or read operation is performed.

The storage device 300 in this embodiment includes a word line divider according to one embodiment of the present invention. Thus, a storage device which has a simplified circuit structure and a short cycle time during random access can be obtained.

This embodiment can be combined with any of the other embodiments disclosed in this specification as appropriate.

Embodiment 4

In this embodiment, examples of a transistor including an oxide semiconductor layer that can be used in the storage device in the above embodiment are described.

Structure examples of the transistor including an oxide semiconductor layer are described with reference to FIGS. 9A to 9D. FIGS. 9A to 9D are cross-sectional schematic diagrams illustrating structure examples of the transistor in this embodiment.

Figure 9A:
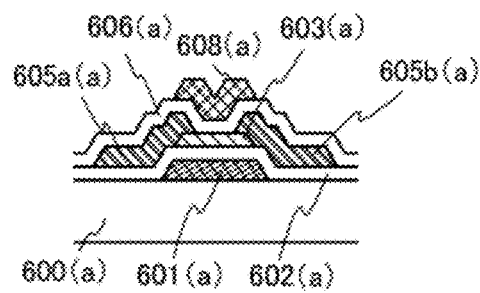
FIGS. 9A to 9D each illustrate the structure of a transistor according to one embodiment of the present invention.

The transistor illustrated in FIG. 9A includes a conductive layer 601(*a*), an insulating layer 602(*a*), a semiconductor layer 603(*a*), a conductive layer 605*a*(*a*), a conductive layer 605*b*(*a*), an insulating layer 606(*a*), and a conductive layer 608(*a*).

The conductive layer 601(*a*) is provided over an element formation layer 600(*a*).

The insulating layer 602(*a*) is provided over the conductive layer 601(*a*).

The semiconductor layer 603(*a*) overlaps with the conductive layer 601(*a*) with the insulating layer 602(*a*) provided therebetween.

The conductive layer 605*a*(*a*) and the conductive layer 605*b*(*a*) are provided over the semiconductor layer 603(*a*) and are electrically connected to the semiconductor layer 603(*a*).

The insulating layer 606(*a*) is provided over the semiconductor layer 603(*a*), the conductive layer 605*a*(*a*), and the conductive layer 605*b*(*a*).

The conductive layer 608(*a*) overlaps with the semiconductor layer 603(*a*) with the insulating layer 606(*a*) provided therebetween.

Note that one of the conductive layer 601(*a*) and the conductive layer 608(*a*) is not necessarily provided. When the conductive layer 608(*a*) is not provided, the insulating layer 606(*a*) is not necessarily provided.

Figure 9B:
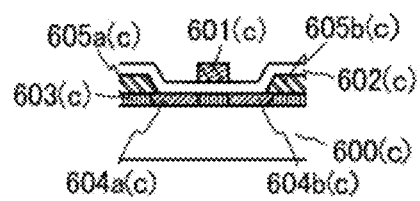

The transistor illustrated in FIG. 9B includes a conductive layer 601(*b*), an insulating layer 602(*b*), a semiconductor layer 603(*b*), a conductive layer 605*a*(*b*), a conductive layer 605*b*(*b*), an insulating layer 606(*b*), and a conductive layer 608(*b*).

The conductive layer 601(*b*) is provided over an element formation layer 600(*b*).

The insulating layer 602(*b*) is provided over the conductive layer 601(*b*).

The conductive layer 605*a*(*b*) and the conductive layer 605*b*(*b*) are provided over part of the insulating layer 602(*b*).

The semiconductor layer 603(*b*) is provided over the conductive layer 605*a*(*b*) and the conductive layer 605*b*(*b*) and is electrically connected to the conductive layer 605*a*(*b*) and the conductive layer 605*b*(*b*). The semiconductor layer 603(*b*) overlaps with the conductive layer 601(*b*) with the insulating layer 602(*b*) provided therebetween.

The insulating layer 606(*b*) is provided over the semiconductor layer 603(*b*), the conductive layer 605*a*(*b*), and the conductive layer 605*b*(*b*).

The conductive layer 608(*b*) overlaps with the semiconductor layer 603(*b*) with the insulating layer 606(*b*) provided therebetween.

Note that one of the conductive layer 601(*b*) and the conductive layer 608(*b*) is not necessarily provided. When the conductive layer 608(*b*) is not provided, the insulating layer 606(*b*) is not necessarily provided.

Figure 9C:
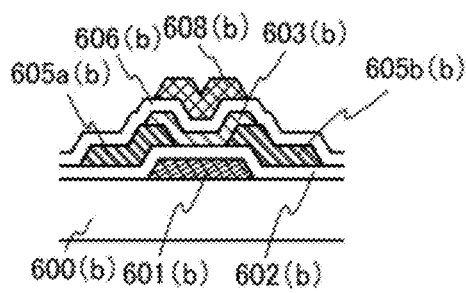

The transistor illustrated in FIG. 9C includes a conductive layer 601(*c*), an insulating layer 602(*c*), a semiconductor layer 603(*c*), a conductive layer 605*a*(*c*), and a conductive layer 605*b*(*c*).

The semiconductor layer 603(*c*) includes a region 604*a*(*c*) and a region 604*b*(*c*). The region 604*a*(*c*) and the region 604*b*(*c*) are spaced apart from each other, and dopants are added to the region 604*a*(*c*) and the region 604*b*(*c*). A region between the region 604*a*(*c*) and the region 604*b*(*c*) is a channel formation region. The semiconductor layer 603(*c*) is provided over an element formation layer 600(*c*). Note that the region 604*a*(*c*) and the region 604*b*(*c*) are not necessarily provided.

The conductive layer 605*a*(*c*) and the conductive layer 605*b*(*c*) are provided over the semiconductor layer 603(*c*) and are electrically connected to the semiconductor layer 603(*c*). The conductive layer 605*a*(*c*) and the conductive layer 605*b*(*c*) are tapered.

The conductive layer 605*a*(*c*) overlaps with part of the region 604*a*(*c*); however, this embodiment is not necessarily limited thereto. When the conductive layer 605*a*(*c*) overlaps with part of the region 604*a*(*c*), resistance between the conductive layer 605*a*(*c*) and the region 604*a*(*c*) can be lowered. The entire region of the semiconductor layer 603(*c*) that overlaps with the conductive layer 605*a*(*c*) may be the region 604*a*(*c*).

The conductive layer 605*b*(*c*) overlaps with part of the region 604*b*(*c*); however, this embodiment is not necessarily limited thereto. When the conductive layer 605*b*(*c*) overlaps with part of the region 604*b*(*c*), resistance between the conductive layer 605*b*(*c*) and the region 604*b*(*c*) can be reduced. The entire region of the semiconductor layer 603(*c*) that overlaps with the conductive layer 605*b*(*c*) may be the region 604*b*(*c*).

The insulating layer 602(*c*) is provided over the semiconductor layer 603(*c*), the conductive layer 605*a*(*c*), and the conductive layer 605*b*(*c*).

The conductive layer 601(*c*) overlaps with the semiconductor layer 603(*c*) with the insulating layer 602(*c*) provided therebetween. A region of the semiconductor layer 603(*c*) that overlaps with the conductive layer 601(*c*) with the insulating layer 602(*c*) provided therebetween is a channel formation region.

Figure 9D:
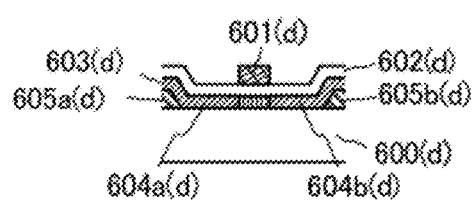

The transistor illustrated in FIG. 9D includes a conductive layer 601(*d*), an insulating layer 602(*d*), a semiconductor layer 603(*d*), a conductive layer 605*a*(*d*), and a conductive layer 605*b*(*d*).

The conductive layer 605*a*(*d*) and the conductive layer 605*b*(*d*) are provided over an element formation layer 600(*d*). The conductive layer 605*a*(*d*) and the conductive layer 605*b*(*d*) are tapered.

The semiconductor layer 603(*d*) includes a region 604*a*(*d*) and a region 604*b*(*d*). The region 604*a*(*d*) and the region 604*b*(*d*) are spaced apart from each other, and dopants are added to the region 604*a*(*d*) and the region 604*b*(*d*). A region between the region 604*a*(*d*) and the region 604*b*(*d*) is a channel formation region. For example, the semiconductor layer 603(*d*) is provided over the conductive layer 605*a*(*d*), the conductive layer 605*b*(*d*), and the element formation layer 600(*d*), and is electrically connected to the conductive layer 605*a*(*d*) and the conductive layer 605*b*(*d*). Note that the region 604*a*(*d*) and the region 604*b*(*d*) are not necessarily provided.

The region 604*a*(*d*) is electrically connected to the conductive layer 605*a*(*d*).

The region 604*b*(*d*) is electrically connected to the conductive layer 605*b*(*d*).

The insulating layer 602(*d*) is provided over the semiconductor layer 603(*d*).

The conductive layer 601(*d*) overlaps with the semiconductor layer 603(*d*) with the insulating layer 602(*d*) provided therebetween. A region of the semiconductor layer 603(*d*) that overlaps with the conductive layer 601(*d*) with the insulating layer 602(*d*) provided therebetween is a channel formation region.

The components illustrated in FIGS. 9A to 9D are described below.

Insulating layers, substrates having insulating surfaces, or the like can be used as the element formation layers 600(*a*) to 600(*d*), for example. Alternatively, layers over which elements are formed in advance can be used as the element formation layers 600(*a*) to 600(*d*).

The conductive layers 601(a) to 601(d) each function as a gate of the transistor. Note that a layer functioning as a gate of a transistor is also referred to as a gate electrode or a gate line.

A layer of a metal material such as molybdenum, magnesium, titanium, chromium, tantalum, tungsten, aluminum, copper, neodymium, or scandium or an alloy material containing the metal material as a main component can be used as each of the conductive layers 601(a) to 601(d), for example. Each of the conductive layers 601(a) to 601(d) can be formed using a stack of layers of materials that can be used for the conductive layers 601(a) to 601(d).

The insulating layers 602(a) to 602(d) each function as a gate insulating layer of the transistor.

A silicon oxide layer, a silicon nitride layer, a silicon oxynitride layer, a silicon nitride oxide layer, an aluminum oxide layer, an aluminum nitride layer, an aluminum oxynitride layer, an aluminum nitride oxide layer, a hafnium oxide layer, or a lanthanum oxide layer can be used as each of the insulating layers 602(a) to 602(d), for example.

Alternatively, an insulating layer of a material containing a Group 13 element of the periodic table and an oxygen element can be used as each of the insulating layers 602(a) to 602(d), for example. For example, in the case where the semiconductor layers 603(a) to 603(d) each contain a Group 13 element, the use of insulating layers each containing a Group 13 element as insulating layers which are in contact with the semiconductor layers 603(a) to 603(d) makes the state of interfaces between the insulating layers and the semiconductor layers favorable.

Examples of the material containing a Group 13 element and an oxygen element include gallium oxide, aluminum oxide, aluminum gallium oxide, and gallium aluminum oxide. Note that aluminum gallium oxide is a substance in which the aluminum content is higher than that of gallium in atomic percent (at. %), and gallium aluminum oxide is a substance in which the gallium content is higher than or equal to that of aluminum in atomic percent (at. %). A material represented by $Al_2O_x$ (x=3+α, where α is larger than 0 and smaller than 1), $Ga_2O_x$ (x=3+α, where α is larger than 0 and smaller than 1), or $Ga_xAl_{2-x}O_{3+α}$ (x is larger than 0 and smaller than 2 and a is larger than 0 and smaller than 1) can be used, for example.

Each of the insulating layers 602(a) to 602(d) can be formed using a stack of layers of materials that can be used for the insulating layers 602(a) to 602(d). For example, each of the insulating layers 602(a) to 602(d) may be formed using a stack of a plurality of layers containing gallium oxide represented by $Ga_2O_x$. Alternatively, each of the insulating layers 602(a) to 602(d) may be formed using a stack of an insulating layer containing gallium oxide represented by $Ga_2O_x$ and an insulating layer containing aluminum oxide represented by $Al_2O_x$.

The semiconductor layers 603(a) to 603(d) each function as a layer in which a channel of the transistor is formed. As an oxide semiconductor that can be used for each of the semiconductor layers 603(a) to 603(d), a metal oxide such as a quaternary metal oxide, a ternary metal oxide, or a binary metal oxide can be used, for example.

An oxide semiconductor used preferably contains at least indium (In) or zinc (Zn). In particular, the oxide semiconductor preferably contains In and Zn. As a stabilizer for reducing variations in electrical characteristics of a transistor including the oxide semiconductor, the oxide semiconductor preferably contains gallium (Ga) in addition to In and Zn. Tin (Sn) is preferably contained as a stabilizer. Hafnium (Hf) is preferably contained as a stabilizer. Aluminum (Al) is preferably contained as a stabilizer.

As another stabilizer, one or more kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

An In—Sn—Ga—Zn—O-based metal oxide, an In—Sn—Al—Zn—O-based metal oxide, an In—Sn—Hf—Zn—O-based metal oxide, an In—Hf—Al—Zn—O-based metal oxide, or the like can be used as the quaternary metal oxide, for example.

An In—Ga—Zn—O-based metal oxide, an In—Sn—Zn—O-based metal oxide, an In—Al—Zn—O-based metal oxide, a Sn—Ga—Zn—O-based metal oxide, an Al—Ga—Zn—O-based metal oxide, a Sn—Al—Zn—O-based metal oxide, an In—Hf—Zn—O-based metal oxide, an In—La—Zn—O-based metal oxide, an In—Ce—Zn—O-based metal oxide, an In—Pr—Zn—O-based metal oxide, an In—Nd—Zn—O-based metal oxide, an In—Pm—Zn—O-based metal oxide, an In—Sm—Zn—O-based metal oxide, an In—Eu—Zn—O-based metal oxide, an In—Gd—Zn—O-based metal oxide, an In—Tb—Zn—O-based metal oxide, an In—Dy—Zn—O-based metal oxide, an In—Ho—Zn—O-based metal oxide, an In—Er—Zn—O-based metal oxide, an In—Tm—Zn—O-based metal oxide, an In—Yb—Zn—O-based metal oxide, an In—Lu—Zn—O-based metal oxide, or the like can be used as the ternary metal oxide, for example.

An In—Zn—O-based metal oxide, a Sn—Zn—O-based metal oxide, an Al—Zn—O-based metal oxide, a Zn—Mg—O-based metal oxide, a Sn—Mg—O-based metal oxide, an In—Mg—O-based metal oxide, an In—Sn—O-based metal oxide, an In—Ga—O-based metal oxide, or the like can be used as the binary metal oxide, for example.

An In—O-based metal oxide, a Sn—O-based metal oxide, a Zn—O-based metal oxide, or the like can be used as the oxide semiconductor, for example. The metal oxide that can be used as the oxide semiconductor may contain silicon oxide.

For example, an In—Ga—Zn-based oxide with an atomic ratio of In:Ga:Zn=1:1:1 or In:Ga:Zn=2:2:1, or an oxide whose composition is in the neighborhood of the above composition can be used for the semiconductor layer. Alternatively, an In—Sn—Zn-based oxide with an atomic ratio of In:Sn:Zn=1:1:1, In:Sn:Zn=2:1:3, or In:Sn:Zn=2:1:5, or an oxide whose composition is in the neighborhood of the above composition is preferably used.

However, without limitation on the materials given above, a material with an appropriate composition may be used in accordance with needed semiconductor characteristics (e.g., mobility, threshold voltage, and variation). In order to obtain needed semiconductor characteristics, it is preferable that carrier concentration, impurity concentration, defect density, an atomic ratio between a metal element and oxygen, interatomic distance, density, and the like be set to appropriate values.

Alternatively, a material represented by $InLO_3(ZnO)_m$ (m is larger than 0 and is not an integer) can be used as the oxide semiconductor. Here, L in $InLO_3(ZnO)_m$ represents one or more metal elements selected from Ga, Al, Mn, or Co.

The oxide semiconductor may be either single crystal or non-single-crystal. In the latter case, the oxide semiconductor may be either amorphous or polycrystal. Further, the oxide semiconductor may have either an amorphous structure including a crystalline portion or a non-amorphous structure.

An amorphous oxide semiconductor can have a flat surface comparatively easily, so that when a transistor is formed using the oxide semiconductor, interface scattering can be reduced, and comparatively high mobility can be obtained comparatively easily.

In a crystalline oxide semiconductor, defects in a bulk can be further reduced and when surface flatness is improved, mobility which is higher than or equal to the mobility of an amorphous oxide semiconductor can be obtained. In order to improve the surface flatness, the oxide semiconductor is preferably formed over a flat surface. Specifically, the oxide semiconductor may be formed over a surface with an average surface roughness $R_a$ of 1 nm or less, preferably 0.3 nm or less, more preferably 0.1 nm or less.

At least a region of each of the semiconductor layers 603(a) to 603(d) in which a channel is formed may be crystalline and non-single-crystal and may include a phase which has triangular, hexagonal, regular triangular, or regular hexagonal atomic order when seen from a direction perpendicular to the a-b plane and in which metal atoms are arranged in a layered manner in the c-axis direction or the metal atoms and oxygen atoms are arranged in a layered manner in the c-axis direction. A material including the phase is also referred to as a c-axis aligned crystalline oxide semiconductor (CAAC-OS).

A transistor including a crystalline oxide semiconductor can be a highly reliable transistor in which degradation of a transistor due to stress (degradation due to gate bias stress or the like) and changes in electrical characteristics of a transistor due to irradiation with visible light or ultraviolet light are inhibited.

Further, when the channel length of the transistor is 30 nm, each of the thicknesses of the semiconductor layers 603(a) to 603(d) may be approximately 5 nm. In that case, if each of the semiconductor layers 603(a) to 603(d) is an oxide semiconductor (CAAC-OS) layer, a short-channel effect in the transistor can be inhibited.

Note that CAAC-OS will be described in detail in Embodiment 6.

A dopant imparting n-type or p-type conductivity is added to each of the regions 604a(c), 604b(c), 604a(d), and 604b(d), and the regions 604a(c), 604b(c), 604a(d), and 604b(d) each function as a source or a drain of the transistor. A Group 13 element of the periodic table (e.g., boron), a Group 15 element of the periodic table (e.g., nitrogen, phosphorus, or arsenic), or the like can be used as the dopant. Note that a region functioning as a source of a transistor is also referred to as a source region, and a region functioning as a drain of a transistor is also referred to as a drain region. When the dopant is added to each of the regions 604a(c), 604b(c), 604a(d), and 604b(d), contact resistance between the region and the conductive layer can be reduced, so that the transistor can be miniaturized.

The conductive layers 605a(a) to 605a(d) and the conductive layers 605b(a) to 605b(d) each function as a source or a drain of the transistor. Note that a layer functioning as a source of a transistor is also referred to as a source electrode or a source line, and a layer functioning as a drain of a transistor is also referred to as a drain electrode or a drain line.

A layer of a metal material such as aluminum, magnesium, chromium, copper, tantalum, titanium, molybdenum, or tungsten or an alloy material which contains the metal material as a main component can be used as each of the conductive layers 605a(a) to 605a(d) and the conductive layers 605b(a) to 605b(d), for example. For example, a layer of an alloy material containing copper, magnesium, and aluminum can be used as each of the conductive layers 605a(a) to 605a(d) and the conductive layers 605b(a) to 605b(d). Alternatively, each of the conductive layers 605a(a) to 605a(d) and the conductive layers 605b(a) to 605b(d) can be formed using a stack of layers of materials that can be used for the conductive layers 605a(a) to 605a(d) and the conductive layers 605b(a) to 605b(d). For example, each of the conductive layers 605a(a) to 605a(d) and the conductive layers 605b(a) to 605b(d) can be formed using a stack of a layer of an alloy material containing copper, magnesium, and aluminum and a layer containing copper.

Alternatively, a layer containing a conductive metal oxide can be used as each of the conductive layers 605a(a) to 605a(d) and the conductive layers 605b(a) to 605b(d). Indium oxide, tin oxide, zinc oxide, indium oxide-tin oxide, or indium oxide-zinc oxide can be used as the conductive metal oxide, for example. Note that the conductive metal oxide that can be used for each of the conductive layers 605a(a) to 605a(d) and the conductive layers 605b(a) to 605b(d) may contain silicon oxide.

A layer of a material that can be used for the insulating layers 602(a) to 602(d) can be used as each of the insulating layers 606(a) and 606(b). Alternatively, each of the insulating layers 606(a) and 606(b) can be formed using a stack of materials that can be used for the insulating layers 606(a) and 606(b). For example, a silicon oxide layer, an aluminum oxide layer, or the like may be used as each of the insulating layers 606(a) and 606(b). For example, the use of an aluminum oxide layer can enhance the effect of inhibiting mixing of impurities into the semiconductor layers 603(a) and 603(b) and the effect of inhibiting elimination of oxygen in the semiconductor layers 603(a) and 603 (b).

The conductive layers 608(a) and 608(b) each function as a gate of the transistor. Note that when the transistor includes both of the conductive layers 601(a) and 608(a) or both of the conductive layers 601(b) and 608(b), one of the conductive layers 601(a) and 608(a) or one of the conductive layers 601(b) and 608(b) is also referred to as a back gate, a back gate electrode, or a back gate line. When a plurality of conductive layers each functioning as a gate are provided with a channel formation layer provided therebetween, the threshold voltage of the transistor can be easily controlled.

A layer of a material that can be used for the conductive layers 601(a) to 601(d) can be used as each of the conductive layers 608(a) and 608(b), for example. Alternatively, each of the conductive layers 608(a) and 608(b) may be formed using a stack of layers of materials that can be used for the conductive layers 608(a) and 608(b).

Note that the transistor in this embodiment may have a structure in which an insulating layer is provided over part of the semiconductor layer functioning as a channel formation layer and a conductive layer functioning as a source or a drain is provided to overlap with the semiconductor layer with the insulating layer provided therebetween. In the case of the above structure, the insulating layer functions as a layer for protecting the channel formation layer (also referred to as a channel protective layer) of the transistor. As the insulating layer functioning as a channel protective layer, a layer of a material that can be used for the insulating layers 602(a) to 602(d) can be used, for example. Alternatively, an insulating layer functioning as a channel protective layer may be formed using a stack of materials that can be used for the insulating layers 602(a) to 602(d).

Alternatively, base layers may be formed over the element formation layers 600(a) to 600(d) and the transistors may be formed over the base layers. In that case, a layer of a material that can be used for the insulating layers 602(a) to 602(d)

can be used as the base layer, for example. Alternatively, the base layer may be formed using a stack of materials that can be used for the insulating layers 602(a) to 602(d). For example, when the base layer is formed using a stack of an aluminum oxide layer and a silicon oxide layer, elimination of oxygen included in the base layer through the semiconductor layers 603(a) to 603(d) can be inhibited.

Next, as an example of a method for forming the transistor in this embodiment, an example of a method for forming the transistor illustrated in FIG. 9A is described below with reference to FIGS. 10A to 10E. FIGS. 10A to 10E are cross-sectional schematic diagrams illustrating the example of the method for forming the transistor illustrated in FIG. 9A.

Figure 10A:
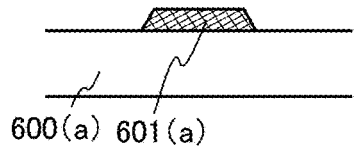
FIGS. 10A to 10E illustrate a method for forming a transistor according to one embodiment of the present invention.

First, as illustrated in FIG. 10A, the element formation layer 600(a) is prepared and a first conductive film is formed over the element formation layer 600(a). Part of the first conductive film is etched, so that the conductive layer 601(a) is formed.

For example, the first conductive film can be formed by formation of a film of a material that can be used for the conductive layer 601(a) by sputtering. Alternatively, the first conductive film can be formed using a stack of films of materials that can be used for the conductive layer 601(a).

Note that when a high-purity gas from which an impurity such as hydrogen, water, a hydroxyl group, or hydride is removed is used as a sputtering gas, for example, the impurity concentration in the film can be lowered.

Note that preheating treatment may be performed in a preheating chamber of a sputtering apparatus before the film is formed by sputtering. By the preheating treatment, an impurity such as hydrogen or moisture can be eliminated.

Before the film is formed by sputtering, for example, treatment by which voltage is applied to a substrate side, not to a target side, in an argon, nitrogen, helium, or oxygen atmosphere with the use of an RF power and plasma is generated so that a surface of the substrate on which the film is formed is modified (such treatment is also referred to as reverse sputtering) may be performed. By reverse sputtering, powdery substances (also referred to as particles or dust) that attach to the surface on which the film is formed can be removed.

In the case where the film is formed by sputtering, moisture remaining in a deposition chamber for the film can be removed by an adsorption vacuum pump or the like. A cryopump, an ion pump, a titanium sublimation pump, or the like can be used as the adsorption vacuum pump. Alternatively, moisture remaining in the deposition chamber can be removed by a turbomolecular pump provided with a cold trap. With the use of the vacuum pump, backflow of exhaust air including impurities can be reduced.

As in the method for forming the conductive layer 601(a), the example of the method for forming the transistor in this embodiment employs, for example, the following steps in order to form a layer by etching of part of a film: a resist mask is formed over part of the film by a photolithography process and the film is etched using the resist mask, so that the layer can be formed. Note that in that case, the resist mask is removed after the layer is formed.

The resist mask may be formed by an inkjet method. A photomask is not needed in an inkjet method; thus, manufacturing cost can be reduced. In addition, the resist mask may be formed using an exposure mask having a plurality of regions with different transmittances (such an exposure mask is also referred to as a multi-tone mask). With the multi-tone mask, a resist mask having a plurality of regions with different thicknesses can be formed, so that the number of resist masks used for the formation of the transistor can be reduced.

Figure 10B:
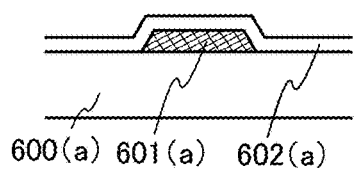

Next, as illustrated in FIG. 10B, the insulating layer 602(a) is formed by formation of a first insulating film over the conductive layer 601(a).

For example, the first insulating film can be formed by formation of a film of a material that can be used for the insulating layer 602(a) by sputtering, plasma-enhanced CVD, or the like. The first insulating film can be formed using a stack of films of materials that can be used for the insulating layer 602(a). Further, when the film of a material that can be used for the insulating layer 602(a) is formed by high-density plasma-enhanced CVD (e.g., high-density plasma-enhanced CVD using microwaves (e.g., microwaves with a frequency of 2.45 GHz)), the insulating layer 602(a) can be dense and can have higher breakdown voltage.

Figure 10C:
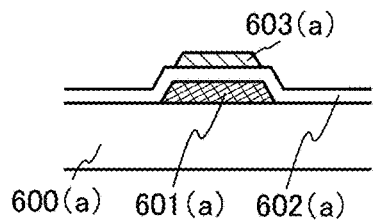

Then, as illustrated in FIG. 10C, an oxide semiconductor film is formed over the insulating layer 602(a). After that, part of the oxide semiconductor film is etched so that the oxide semiconductor layer 603(a) is formed.

For example, the oxide semiconductor film can be formed by formation of a film of an oxide semiconductor material that can be used for the semiconductor layer 603(a) by sputtering. Note that the oxide semiconductor film may be formed in a rare gas atmosphere, an oxygen atmosphere, or a mixed atmosphere of a rare gas and oxygen. Further, in the case where an oxide semiconductor (CAAC-OS) layer is formed as the semiconductor layer 603(a), an oxide semiconductor film is formed by sputtering under the condition that the temperature of the element formation layer over which the oxide semiconductor film is formed is set at 100 to 500° C., preferably 200 to 350° C. At this time, it is preferable that the concentration of impurities such as hydrogen or water in a sputtering apparatus be extremely low. For example, by performing heat treatment before formation of the oxide semiconductor film, the concentration of impurities such as hydrogen or water in the sputtering apparatus can be lowered. Further, in that case, the insulating layer 602(a) is preferably flat. For example, the average surface roughness of the insulating layer 602(a) is preferably less than 0.5 nm, more preferably less than or equal to 0.1 nm.

For example, an oxide target having the following composition ratio can be used as a sputtering target for formation of an oxide semiconductor film: In:Zn=50:1 to 1:2 ($In_2O_3$:ZnO=25:1 to 1:4 in a molar ratio), preferably In:Zn=20:1 to 1:1 ($In_2O_3$:ZnO=10:1 to 1:2 in a molar ratio), more preferably In:Zn=15:1 to 1.5:1 ($In_2O_3$:ZnO=15:2 to 3:4 in a molar ratio). For example, when the atomic ratio of the target used for formation of an In—Zn—O-based oxide semiconductor is expressed by In:Zn:O=S:U:R, R>1.5S+U. An increase in the In content makes the mobility of the transistor higher.

The composition ratio of an oxide semiconductor target used for formation of a material film of an In—Sn—Zn—O-based metal oxide can be In:Sn:Zn=1:2:2, 2:1:3, 1:1:1, 20:45:35, or the like in an atomic ratio.

The composition ratio of an oxide semiconductor target used for formation of a material film of an In—Ga—Zn—O-based metal oxide can be In:Ga:Zn=1:1:0.5, 1:1:1, 1:1:2, or the like in an atomic ratio.

Further, in the case where sputtering is employed, the semiconductor layer 603(a) is formed in a rare gas (typically argon) atmosphere, an oxygen atmosphere, or a mixed atmosphere of a rare gas and oxygen, for example. At this time, in the case where the semiconductor layer 603(a) is formed in a mixed atmosphere of a rare gas and oxygen, the oxygen content is preferably higher than the rare gas content.

Figure 10D:
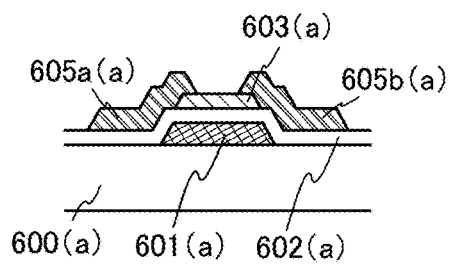

Then, as illustrated in FIG. 10D, a second conductive film is formed over the insulating layer 602(a) and the semiconductor layer 603(a) and is partly etched so that the conductive layer 605a(a) and the conductive layer 605b(a) are formed.

For example, the second conductive film can be formed by formation of a film of a material that can be used for the conductive layers 605a(a) and 605b(a) by sputtering or the like. Alternatively, the second conductive film can be formed using a stack of films of materials that can be used for the conductive layers 605a(a) and 605b(a).

Figure 10E:
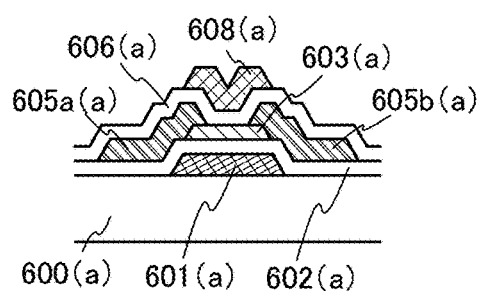

Then, as illustrated in FIG. 10E, the insulating layer 606(a) is formed to be in contact with the semiconductor layer 603(a).

For example, the insulating layer 606(a) can be formed by formation of a film that can be used for the insulating layer 606(a) in a rare gas (typically argon) atmosphere, an oxygen atmosphere, or a mixed atmosphere of a rare gas and oxygen by sputtering. By formation of the insulating layer 606(a) by sputtering, a decrease in resistance of part of the semiconductor layer 603(a) that functions as a back channel of the transistor can be inhibited. The temperature of the substrate during the formation of the insulating layer 606(a) is preferably higher than or equal to room temperature and lower than or equal to 300° C.

Before the formation of the insulating layer 606(a), plasma treatment using a gas such as $N_2O$, $N_2$, or Ar may be performed so that water or the like adsorbed onto an exposed surface of the semiconductor layer 603(a) is removed. In the case where the plasma treatment is performed, the insulating layer 606(a) is preferably formed after the plasma treatment without exposure to the air.

In addition, in the example of the method for forming the transistor illustrated in FIG. 9A, heat treatment is performed at higher than or equal to 600° C. and lower than or equal to 750° C., or higher than or equal to 600° C. and lower than the strain point of the substrate, for example. For example, the heat treatment is performed after the oxide semiconductor film is formed, after part of the oxide semiconductor film is etched, after the second conductive film is formed, after part of the second conductive film is etched, or after the insulating layer 606(a) is formed.

Note that a heat treatment apparatus for the heat treatment can be an electric furnace or an apparatus for heating an object by heat conduction or heat radiation from a heater such as a resistance heater. For example, a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus with which heat treatment is performed using a high-temperature gas. As the high-temperature gas, for example, a rare gas or an inert gas (e.g., nitrogen) which does not react with an object by heat treatment can be used.

After the heat treatment, a high-purity oxygen gas, a high-purity $N_2O$ gas, or ultra dry air (with a dew point of −60° C. or lower, preferably an atmosphere at −60° C. or lower) may be introduced into the furnace that has been used in the heat treatment. In that case, it is preferable that water, hydrogen, and the like be not contained in the oxygen gas or the $N_2O$ gas. The purity of the oxygen gas or the $N_2O$ gas which is introduced into the heat treatment apparatus is preferably 6N or higher, more preferably 7N or higher. That is, the impurity concentration in the oxygen gas or the $N_2O$ gas is 1 ppm or lower, preferably 0.1 ppm or lower. By the action of the oxygen gas or the $N_2O$ gas, oxygen is supplied to the semiconductor layer 603(a), so that defects caused by oxygen deficiency in the semiconductor layer 603(a) can be reduced. Note that the high-purity oxygen gas, the high-purity $N_2O$ gas, or the ultra dry air may be introduced during the heat treatment.

Further, oxygen doping treatment using oxygen plasma may be performed after the formation of the insulating layer 602(a), after the formation of the oxide semiconductor film, after the formation of the conductive layer functioning as a source electrode or a drain electrode, after the formation of the insulating layer over the conductive layer functioning as a source electrode or a drain electrode, or after the heat treatment. For example, oxygen doping treatment may be performed using a high-density plasma of 2.45 GHz. Alternatively, the oxygen doping treatment may be performed by ion implantation. By the oxygen doping treatment, variations in electrical characteristics of the transistors can be reduced. For example, the oxygen doping treatment is performed to make either one or both the insulating layer 602(a) and the insulating layer 606(a) contain oxygen with a higher proportion than the stoichiometric proportion.

When the insulating layer which is in contact with the semiconductor layer 603(a) contains oxygen excessively, oxygen is easily supplied to the semiconductor layer 603(a). This can reduce oxygen defects in the semiconductor layer 603(a) or at an interface between the semiconductor layer 603(a) and either one or both the insulating layer 602(a) and the insulating layer 606(a), thereby reducing the carrier concentration of the semiconductor layer 603(a). Without limitation thereon, even in the case where the semiconductor layer 603(a) contains oxygen excessively through manufacturing steps, elimination of oxygen from the semiconductor layer 603(a) can be inhibited by the insulating layer which is in contact with the semiconductor layer 603(a).

For example, in the case where an insulating layer containing gallium oxide is formed as either one or both the insulating layer 602(a) and the insulating layer 606(a), oxygen is supplied to the insulating layer, so that the composition of gallium oxide can be $Ga_2O_x$.

Alternatively, in the case where an insulating layer containing aluminum oxide is formed as either one or both the insulating layer 602(a) and the insulating layer 606(a), oxygen is supplied to the insulating layer, so that the composition of aluminum oxide can be $Al_2O_x$.

Alternatively, in the case where an insulating layer containing gallium aluminum oxide or aluminum gallium oxide is formed as either one or both the insulating layer 602(a) and the insulating layer 606(a), oxygen is supplied to the insulating layer, so that the composition of gallium aluminum oxide or aluminum gallium oxide can be $Ga_xAl_{2-x}O_{3+\alpha}$.

Through the steps, an impurity such as hydrogen, moisture, a hydroxyl group, or hydride (also referred to as a hydrogen compound) is removed from the semiconductor layer 603(a) and oxygen is supplied to the semiconductor layer 603(a); thus, the semiconductor layer 603(a) can be highly purified.

Further, in addition to the heat treatment, after the insulating layer 606(a) is formed, heat treatment (preferably at 200 to 600° C., for example, 250 to 350° C.) may be performed in an inert gas atmosphere or an oxygen gas atmosphere.

As illustrated in FIG. 10E, a third conductive film is formed over the insulating layer 606(a) and is partly etched so that the conductive layer 608(a) is formed.

For example, the third conductive film can be formed by formation of a film of a material that can be used for the conductive layer 608(a) by sputtering. Alternatively, the third conductive film can be formed using a stack of films of materials that can be used for the third conductive film.

Note that although the example of the method for forming the transistor illustrated in FIG. 9A is described, this embodiment is not limited to this example. For example, if the components illustrated in FIGS. 9B to 9D have the same designations as the components illustrated in FIG. 9A and functions that are at least partly the same as those of the components illustrated in FIG. 9A, the description of the example of the method for forming the transistor illustrated in FIG. 9A can be referred to as appropriate.

In the case where the regions 604a(c) and 604a(d), and the regions 604b(c) and 604b(d) are formed as illustrated in FIGS. 9C and 9D, the regions 604a(c) and 604a(d), and the regions 604b(c) and 604b(d) are formed in a self-aligning manner through insulating layers functioning as gate insulating layers by addition of dopants to semiconductor layers from sides where conductive layers functioning as gates are formed.

For example, the dopants can be added with the use of an ion doping apparatus or an ion implantation apparatus.

As described with reference to FIGS. 9A to 9D and FIGS. 10A to 10E, the example of the transistor in this embodiment includes a conductive layer functioning as a gate; an insulating layer functioning as a gate insulating layer; an oxide semiconductor layer which has a channel and overlaps with the conductive layer functioning as a gate with the insulating layer functioning as a gate insulating layer provided therebetween; a conductive layer which is electrically connected to the oxide semiconductor layer and functions as one of a source and a drain; and a conductive layer which is electrically connected to the oxide semiconductor layer and functions as the other of the source and the drain.

The oxide semiconductor layer in which a channel is formed is an oxide semiconductor layer which is made to be intrinsic or substantially intrinsic by purification. By purification of the oxide semiconductor layer, the carrier concentration in the oxide semiconductor layer can be lower than $1\times10^{14}/cm^3$, preferably lower than $1\times10^{12}/cm^3$, more preferably lower than $1\times10^{11}/cm^3$. Further, with the above structure, off-state current per micrometer of channel width can be 10 aA ($1\times10^{-17}$ A) or lower, 1 aA ($1\times10^{-18}$ A) or lower, 10 zA ($1\times10^{-20}$ A) or lower, 1 zA ($1\times10^{-21}$ A) or lower, or 100 yA ($1\times10^{-22}$ A) or lower. It is preferable that the off-state current of the transistor be as low as possible. The lower limit of the off-state current of the transistor in this embodiment is estimated at approximately $10^{-30}$ A/μm.

When a transistor including an oxide semiconductor layer in this embodiment is used as, for example, a transistor in the word line divider in the above embodiment, a word line divider which has a greatly simplified structure and can operate stably can be obtained.

This embodiment can be combined with any of the other embodiments disclosed in this specification as appropriate.

Embodiment 5

In this embodiment, a structure example of the storage device in the above embodiment is described.

A storage device in this embodiment includes a transistor including a semiconductor layer in which a channel is formed and a Group 14 semiconductor of the periodic table (e.g., silicon) is contained and a transistor including an oxide semiconductor layer in which a channel is formed. In that case, the transistor including an oxide semiconductor layer in which a channel is formed can be stacked over the transistor including a semiconductor layer which contains a Group 14 semiconductor of the periodic table (e.g., silicon). The transistor including a semiconductor layer which contains a Group 14 semiconductor of the periodic table (e.g., silicon) can be used as the selection transistor 111 in FIG. 1 or the transistor included in the control circuit 301, the driver circuit 302, or the driver circuit 303 in FIG. 8, for example.

Figure 11:
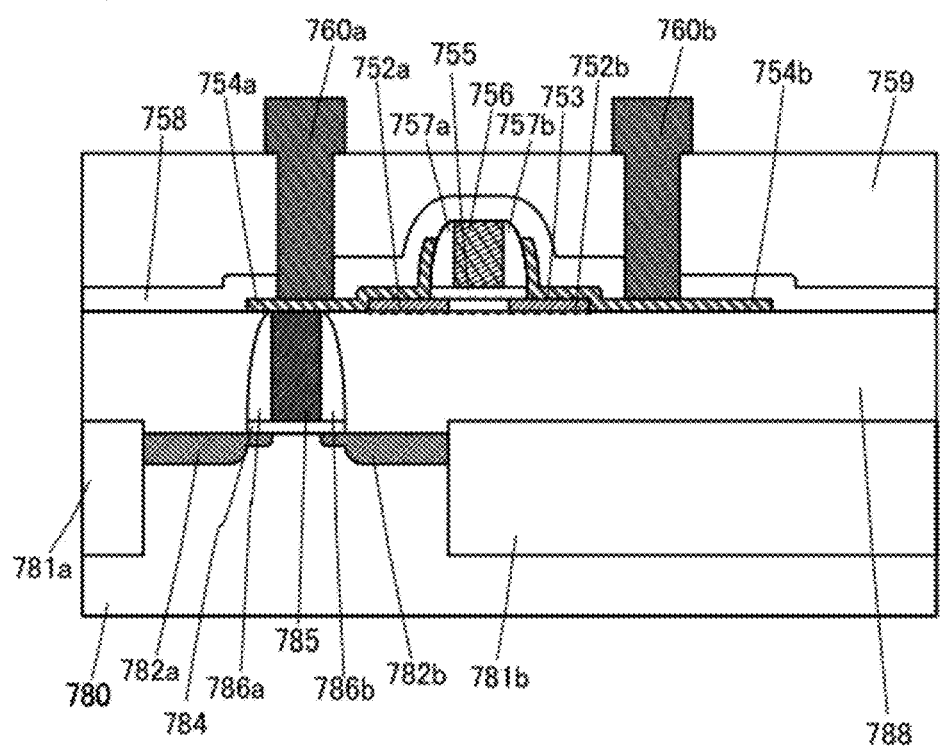
FIG. 11 illustrates the structure of a storage device according to one embodiment of the present invention.

FIG. 11 illustrates an example in which the transistor including an oxide semiconductor layer in which a channel is formed is stacked over the transistor including a semiconductor layer which contains a Group 14 semiconductor of the periodic table (e.g., silicon). Note that the sizes of some components illustrated in FIG. 11 are different from actual sizes.

In FIG. 11, an n-channel transistor (e.g., the selection transistor 111 illustrated in FIG. 1) including a semiconductor layer which contains a Group 14 semiconductor of the periodic table (e.g., silicon) and a transistor (e.g., the transistor 101 illustrated in FIG. 1) including an oxide semiconductor layer in which a channel is formed are formed using a semiconductor layer 780, an insulating layer 784, a conductive layer 785, an insulating layer 786a, an insulating layer 786b, an insulating layer 788, a semiconductor layer 753, a conductive layer 754a, a conductive layer 754b, an insulating layer 755, a conductive layer 756, an insulating layer 757a, an insulating layer 757b, an insulating layer 758, an insulating layer 759, a conductive layer 760a, and a conductive layer 760b.

Further, the semiconductor layer 780 includes a region 782a and a region 782b. The semiconductor layer 780 includes an insulating region 781a and an insulating region 781b, and the transistor is electrically isolated from adjacent transistors (not illustrated).

For example, a semiconductor substrate can be used as the semiconductor layer 780. Alternatively, a semiconductor layer provided over a different substrate can be used as the semiconductor layer 780.

The region 782a and the region 782b are spaced apart from each other, and a dopant imparting n-type conductivity is added to the region 782a and the region 782b. The region 782a and the region 782b function as a source and drain regions of the n-channel transistor. For example, the region 782a and the region 782b may each be electrically connected to an additionally provided conductive layer.

Note that when a dopant imparting p-type conductivity is added to the region 782a and the region 782b, the region 782a and the region 782b can function as a source and drain regions of the p-channel transistor.

Note that a low-concentration region may be partly provided in each of the region 782a and the region 782b. In that case, the low-concentration regions may be shallower than the rest of the region 782a and the region 782b; however, this embodiment is not limited thereto.

The insulating layer 784 is provided over a region of the semiconductor layer 780 that is between the insulating region 781a and the insulating region 781b. The insulating layer 784 functions as a gate insulating layer of the n-channel transistor.

A layer of a material such as silicon oxide, silicon nitride, silicon oxynitride, silicon nitride oxide, aluminum oxide, aluminum nitride, aluminum oxynitride, aluminum nitride oxide, hafnium oxide, or an organic insulating material (e.g., polyimide or acrylic) can be used as the insulating layer 784, for example. The insulating layer 784 may be formed using a stack of materials that can be used for the insulating layer 784.

The conductive layer 785 overlaps with the semiconductor layer 780 with the insulating layer 784 provided therebetween. A region of the semiconductor layer 780 that overlaps with the conductive layer 785 is a channel formation region of the n-channel transistor. The conductive layer 785 functions as a gate of the n-channel transistor.

A layer of a metal material such as molybdenum, magnesium, titanium, chromium, tantalum, tungsten, aluminum, copper, neodymium, or scandium or an alloy material containing the metal material as a main component can be used as the conductive layer 785, for example. The conductive layer 785 may be formed using a stack of materials that can be used for the conductive layer 785.

The insulating layer 786a is provided over the insulating layer 784 and is in contact with one of a pair of side surfaces of the conductive layer 785 that face each other.

The insulating layer 786b is provided over the insulating layer 784 and is in contact with the other of the pair of side surfaces of the conductive layer 785 that face each other.

The insulating layer 788 is provided over the conductive layer 785, the insulating layer 786a, and the insulating layer 786b.

Each of the insulating layers 786a, 786b, and 788 can be formed using any of the materials that can be used for the insulating layer 784, which may be the same as or different from the material used for the insulating layer 784. Alternatively, each of the insulating layers 786a, 786b, and 788 can be formed using a stack of layers of materials that can be used for the insulating layers 786a, 786b, and 788.

The semiconductor layer 753 is provided over the insulating layer 788. The semiconductor layer 753 includes a region 752a and a region 752b. The region 752a and the region 752b are regions to which a dopant is added, and function as a source and drain regions. Any of the dopants that can be used for the transistor including an oxide semiconductor layer in the above embodiment can be used as the dopant as appropriate. Note that the region 752a and the region 752b are not necessarily provided.

A layer of a material that can be used for the semiconductor layer 603(*a*) illustrated in FIG. 9A can be used as the semiconductor layer 753, for example.

The insulating layer 755 is provided over the semiconductor layer 753. The insulating layer 755 functions as a gate insulating layer of the transistor.

A layer of a material that can be used for the insulating layer 602(*a*) illustrated in FIG. 9A can be used as the insulating layer 755, for example. Alternatively, the insulating layer 755 may be formed using a stack of materials that can be used for the insulating layer 755.

The conductive layer 756 overlaps with the semiconductor layer 753 with the insulating layer 755 provided therebetween. The conductive layer 756 functions as a gate of the transistor.

A layer of a material that can be used for the conductive layer 601(*a*) illustrated in FIG. 9A can be used as the conductive layer 756, for example. Alternatively, the conductive layer 756 may be formed using a stack of materials that can be used for the conductive layer 756.

The insulating layer 757a and the insulating layer 757b are provided over the insulating layer 755 and in contact with side surfaces of the conductive layer 756. Note that the insulating layer 757a and the insulating layer 757b are not necessarily provided.

The conductive layer 754a is in contact with and electrically connected to the semiconductor layer 753. The conductive layer 754a is electrically connected to the conductive layer 785. The conductive layer 754a functions as a source or a drain of the transistor including an oxide semiconductor layer.

The conductive layer 754b is in contact with and electrically connected to the semiconductor layer 753. The conductive layer 754b functions as the source or the drain of the transistor including an oxide semiconductor layer.

A layer of a material that can be used for the conductive layers 605a(*a*) and 605b(*a*) illustrated in FIG. 9A can be used as each of the conductive layers 754a and 754b, for example. Alternatively, each of the conductive layers 754a and 754b may be formed using a stack of layers of materials that can be used for the conductive layers 754a and 754b.

The insulating layer 758 is provided over the conductive layer 756, the insulating layer 757a, the insulating layer 757b, the conductive layer 754a, and the conductive layer 754b.

A layer of a material that can be used for the insulating layer 602(*a*) illustrated in FIG. 9A can be used as the insulating layer 758, for example. Alternatively, the insulating layer 758 may be formed using a stack of materials that can be used for the insulating layer 758. The insulating layer 758 functions as a protective layer for preventing entry of an impurity.

The insulating layer 759 is provided over the insulating layer 758.

A layer of a material that can be used for the insulating layer 602(*a*) illustrated in FIG. 9A can be used as the insulating layer 759, for example. Alternatively, the insulating layer 759 can be formed using a stack of materials that can be used for the insulating layer 759.

The conductive layer 760a is electrically connected to the conductive layer 754a through an opening formed in the insulating layer 758 and the insulating layer 759. The conductive layer 760a functions as the source or the drain of the transistor including an oxide semiconductor layer.

The conductive layer 760b is electrically connected to the conductive layer 754b through an opening formed in the insulating layer 758 and the insulating layer 759. The conductive layer 760b functions as the source or the drain of the transistor including an oxide semiconductor layer.

A layer of a material that can be used for the conductive layers 605a(*a*) and 605b(*a*) illustrated in FIG. 9A can be used as each of the conductive layers 760a and 760b, for example. Alternatively, each of the conductive layers 760a and 760b may be formed using a stack of materials that can be used for the conductive layers 760a and 760b.

The above is the description of the structure example of the storage device illustrated in FIG. 11.

As described with reference to FIG. 11, in the structure example of the storage device in this embodiment, when the storage device has a stack of transistors which include semiconductor layers formed using different materials, the circuit area can be reduced.

This embodiment can be combined with any of the other embodiments disclosed in this specification as appropriate.

Embodiment 6

An oxide semiconductor film can be single crystal, polycrystalline (also referred to as polycrystal), or amorphous, for example. The oxide semiconductor film is preferably a CAAC-OS film.

In this embodiment, a film of an oxide (CAAC-OS) including a crystal with c-axis alignment that has triangular or hexagonal atomic order when seen from the direction of the a-b plane, a surface, or an interface is described. In the crystal, metal atoms are arranged in a layered manner, or metal atoms and oxygen atoms are arranged in a layered manner along the c-axis, and the direction of the a-axis or the b-axis is varied in the a-b plane (the crystal rotates around the c-axis).

CAAC-OS is not a single crystal but this does not mean that CAAC-OS is composed of only an amorphous component. The CAAC-OS film is an oxide semiconductor film with a crystal-amorphous mixed phase structure where crystal parts and amorphous parts are included in an amorphous phase. Note that in most cases, the crystal part fits into a cube whose one side is less than 100 nm. From an observation image obtained with a transmission electron microscope (TEM), a boundary between the amorphous part and the crystal part in the CAAC-OS film is not clear. Further, with the TEM, a grain boundary in the CAAC-OS film is not found. Thus, in the CAAC-OS film, a decrease in electron mobility due to the grain boundary is inhibited.

In each of the crystal parts included in the CAAC-OS film, a c-axis is aligned in a direction parallel to a normal vector of a surface where the CAAC-OS film is formed or a normal vector of a surface of the CAAC-OS film, triangular or hexagonal atomic order which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a simple term "perpendicular" includes a range from 85 to 95°. In addition, a simple term "parallel" includes a range from −5 to 5°.

Nitrogen may be substituted for part of oxygen included in CAAC-OS. The c-axes of the crystalline parts included in CAAC-OS may be aligned in a certain direction (e.g., a direction perpendicular to a surface of a substrate over which CAAC-OS is formed or a surface of CAAC-OS). The normals of the a-b planes of the crystalline parts included in CAAC-OS may be aligned in a certain direction (e.g., a direction perpendicular to a surface of a substrate over which CAAC-OS is formed or a surface of CAAC-OS).

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the CAAC-OS film is higher than that in the vicinity of the surface where the CAAC-OS film is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to the normal vector of the surface where the CAAC-OS film is formed or the normal vector of the surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of the c-axis of the crystal part is the direction parallel to the normal vector of the surface where the CAAC-OS film is formed or the normal vector of the surface of the CAAC-OS film. The crystal part is formed by deposition or by performing treatment for crystallization such as heat treatment after deposition.

CAAC-OS is a conductor, a semiconductor, or an insulator depending on its composition or the like. CAAC-OS transmits or does not transmit visible light depending on its composition or the like.

With the use of the CAAC-OS film in a transistor, changes in electrical characteristics of the transistor due to irradiation with visible light or ultraviolet light can be reduced. Thus, the transistor has high reliability.

As an example of such CAAC-OS, there is an oxide which is formed into a film shape and has triangular or hexagonal atomic order when seen from the direction perpendicular to a surface of the film or a surface of a substrate over which the film is formed, and in which metal atoms are arranged in a layered manner or metal atoms and oxygen atoms (or nitrogen atoms) are arranged in a layered manner when a cross section of the film is observed.

CAAC-OS is described in detail with reference to FIGS. 12A to 12E, FIGS. 13A to 13C, FIGS. 14A to 14C, and FIGS. 15A and 15B. Note that in FIGS. 12A to 12E, FIGS. 13A to 13C, and FIGS. 14A to 14C, the vertical direction corresponds to the c-axis direction and a plane perpendicular to the c-axis direction corresponds to the a-b plane, unless otherwise specified. When terms "upper half" and "lower half" are simply used, they refer to an upper half above the a-b plane and a lower half below the a-b plane (an upper half and a lower half with respect to the a-b plane). Further, in FIGS. 12A to 12E, an O atom surrounded by a circle represents a tetracoordinate O atom and a double circle represents a tricoordinate O atom.

Figure 12A:
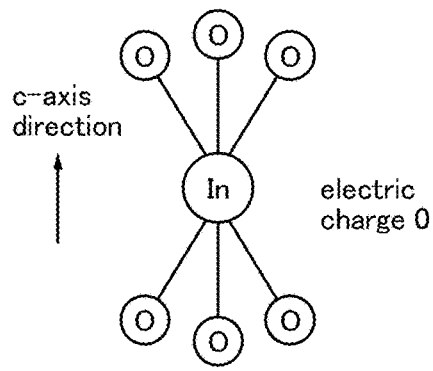
FIGS. 12A to 12E each illustrate the structure of an oxide material according to one embodiment of the present invention.

FIG. 12A illustrates a structure including one hexacoordinate In atom and six tetracoordinate oxygen atoms (hereinafter referred to as tetracoordinate O atoms) close to the In atom. A structure in which one metal atom and oxygen atoms close to the metal atom are only illustrated is called a small group here. The structure in FIG. 12A is actually an octahedral structure, but is illustrated as a planar structure for simplicity. Note that three tetracoordinate O atoms exist in each of an upper half and a lower half in FIG. 12A. In the small group illustrated in FIG. 12A, electric charge is 0.

Figure 12D:
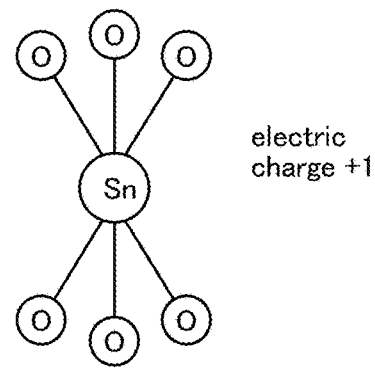
Figure 12B:
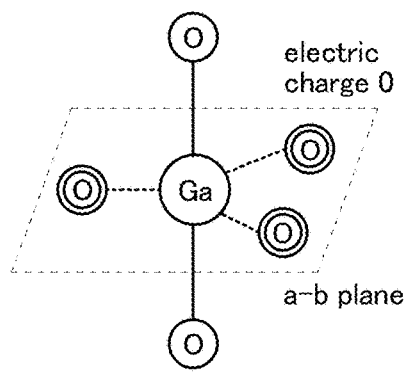

FIG. 12B illustrates a structure including one pentacoordinate Ga atom, three tricoordinate oxygen atoms (hereinafter referred to as tricoordinate O atoms) close to the Ga atom, and two tetracoordinate O atoms close to the Ga atom. All the tricoordinate O atoms exist in the a-b plane. One tetracoordinate O atom exists in each of an upper half and a lower half in FIG. 12B. An In atom can have the structure illustrated in FIG. 12B because the In atom can have five ligands. In a small group illustrated in FIG. 12B, electric charge is 0.

Figure 12E:
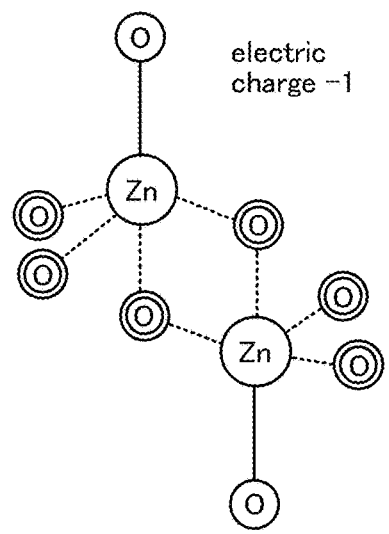
Figure 12C:
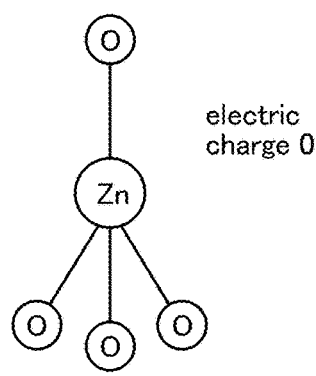

FIG. 12C illustrates a structure including one tetracoordinate Zn atom and four tetracoordinate O atoms close to the Zn atom. In FIG. 12C, one tetracoordinate O atom exists in an upper half and three tetracoordinate O atoms exists in a lower half. Alternatively, three tetracoordinate O atoms may exist in the upper half and one tetracoordinate O atom may exist in the lower half in FIG. 12C. In a small group illustrated in FIG. 12C, electric charge is 0.

FIG. 12D illustrates a structure including one hexacoordinate Sn atom and six tetracoordinate O atoms close to the Sn atom. In FIG. 12D, three tetracoordinate O atoms exists in each of an upper half and a lower half. In a small group illustrated in FIG. 12D, electric charge is +1.

FIG. 12E illustrates a small group including two Zn atoms. In FIG. 12E, one tetracoordinate O atom exists in each of an upper half and a lower half. In the small illustrated in FIG. 12E, electric charge is −1.

Here, a plurality of small groups form a medium group, and a plurality of medium groups form a large group (also referred to as a unit cell).

Here, a rule of bonding the small groups to each other is described. The three O atoms in the upper half with respect to the hexacoordinate In atom in FIG. 12A each have three proximity In atoms in the downward direction, and the three O atoms in the lower half each have three proximity In atoms in the upward direction. The one O atom in the upper half with respect to the pentacoordinate Ga atom in FIG. 12B has one proximity Ga atom in the downward direction, and the one O atom in the lower half has one proximity Ga atom in the upward direction. The one O atom in the upper half with respect to the tetracoordinate Zn atom in FIG. 12C has one proximity Zn atom in the downward direction, and the three O atoms in the lower half each have three proximity Zn atoms in the upward direction. In this manner, the number of the tetracoordinate O atoms above the metal atom is equal to the number of the proximity metal atoms below the tetracoordinate O atoms. Similarly, the number of the tetracoordinate O atoms below the metal atom is equal to the number of the proximity metal atoms above the tetracoordinate O atoms. Since the coordination number of the O atom is 4, the sum of the number of the proximity metal atoms below the O atom and the number of the proximity metal atoms above the O atom is 4. Accordingly, when the sum of the number of the tetracoordinate O atoms above the metal atom and the number of the tetracoordinate O atoms below another metal atom is 4, the two kinds of small groups including the metal atoms can be bonded to each other. For example, in the case where a hexacoordinate metal (In or Sn) atom is bonded through three tetracoordinate O atoms in the upper half, the hexacoordinate metal atom is bonded to a pentacoordinate metal (Ga or In) atom or a tetracoordinate metal (Zn) atom.

A metal atom having the above coordination number is bonded to another metal atom through a tetracoordinate O atom in the c-axis direction. Further, a plurality of small groups are bonded to each other so that the total electric charge in a layer structure is 0. Thus, a medium group is constituted.

Figure 13A:
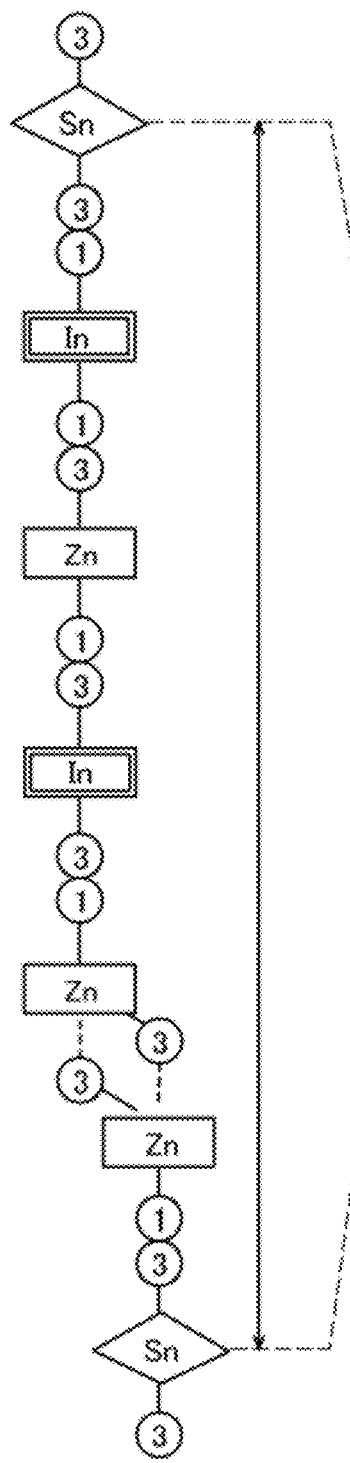
FIGS. 13A to 13C illustrate the structure of an oxide material according to one embodiment of the present invention.
Figure 13B:
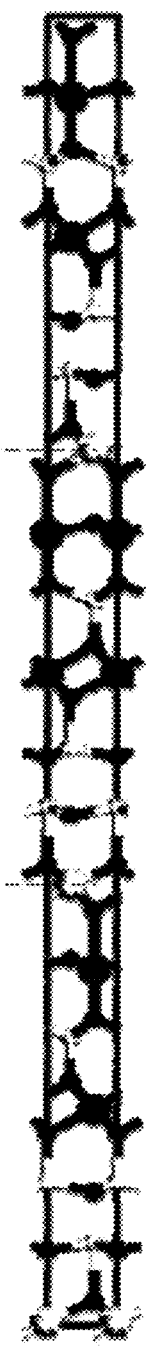
Figure 13C:
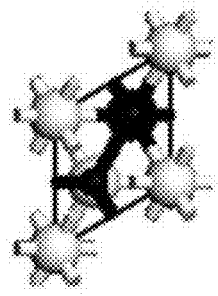

FIG. 13A illustrates a model of a medium group included in a layer structure of an In—Sn—Zn—O-based material. FIG. 13B illustrates a large group including three medium groups. Note that FIG. 13C illustrates atomic order in the case of the layer structure in FIG. 13B observed from the c-axis direction.

In FIG. 13A, for simplicity, a tricoordinate O atom is not illustrated and a tetracoordinate O atom is illustrated by a circle; the number in the circle shows the number of tetracoordinate O atoms. For example, three tetracoordinate O atoms existing in each of an upper half and a lower half with respect to a Sn atom are denoted by circled 3. Similarly, in FIG. 13A, one tetracoordinate O atom existing in each of an upper half and a lower half with respect to an In atom is denoted by circled 1. FIG. 13A also illustrates a Zn atom close to one tetracoordinate O atom in a lower half and three tetracoordinate O atoms in an upper half, and a Zn atom close to one tetracoordinate O atom in an upper half and three tetracoordinate O atoms in a lower half.

In the medium group included in the layer structure of the In—Sn—Zn—O-based material in FIG. 13A, in the order starting from the top, a Sn atom close to three tetracoordinate O atoms in each of an upper half and a lower half is bonded to an In atom close to one tetracoordinate O atom in each of an upper half and a lower half, the In atom is bonded to a Zn atom close to three tetracoordinate O atoms in an upper half, the Zn atom is bonded to an In atom close to three tetracoordinate O atoms in each of an upper half and a lower half through one tetracoordinate O atom in a lower half with respect to the Zn atom, the In atom is bonded to a small group that includes two Zn atoms and is close to one tetracoordinate O atom in an upper half, and the small group is bonded to a Sn atom close to three tetracoordinate O atoms in each of an upper half and a lower half through one tetracoordinate O atom in a lower half with respect to the small group. A plurality of such medium groups are bonded to each other so that a large group is constituted.

Here, electric charge for one bond of a tricoordinate O atom and electric charge for one bond of a tetracoordinate O atom can be assumed to be −0.667 and −0.5, respectively. For example, electric charge of a hexacoordinate or pentacoordinate In atom, electric charge of a tetracoordinate Zn atom, and electric charge of a pentacoordinate or hexacoordinate Sn atom are +3, +2, and +4, respectively. Thus, electric charge of a small group including a Sn atom is +1. Consequently, an electric charge of −1, which cancels an electric charge of +1, is needed to form a layer structure including a Sn atom. As a structure having an electric charge of −1, the small group including two Zn atoms as illustrated in FIG. 12E can be given. For example, when one small group including two Zn atoms is provided for one small group including a Sn atom, electric charge is canceled, so that the total electric charge in the layer structure can be 0.

Specifically, when a large group illustrated in FIG. 13B is formed, an In—Sn—Zn—O-based crystal ($In_2SnZn_3O_8$) can be obtained. Note that the layer structure of the obtained In—Sn—Zn—O-based crystal can be expressed as a composition formula, $In_2SnZn_2O_7(ZnO)_m$ (m is 0 or a natural number).

The above rule also applies to the following oxides: a quaternary metal oxide such as an In—Sn—Ga—Zn—O-based oxide; a ternary metal oxide such as an In—Ga—Zn—O-based oxide (also referred to as IGZO), an In—Al—Zn—O-based oxide, a Sn—Ga—Zn—O-based oxide, an Al—Ga—Zn—O-based oxide, a Sn—Al—Zn—O-based oxide, an In—Hf—Zn—O-based oxide, an In—La—Zn—O-based oxide, an In—Ce—Zn—O-based oxide, an In—Pr—Zn—O-based oxide, an In—Nd—Zn—O-based oxide, an In—Pm—Zn—O-based oxide, an In—Sm—Zn—O-based oxide, an In—Eu—Zn—O-based oxide, an In—Gd—Zn—O-based oxide, an In—Tb—Zn—O-based oxide, an In—Dy—Zn—O-based oxide, an In—Ho—Zn—O-based oxide, an In—Er—Zn—O-based oxide, an In—Tm—Zn—O-based oxide, an In—Yb—Zn—O-based oxide, or an In—Lu—Zn—O-based oxide; a binary metal oxide such as an In—Zn—O-based oxide, a Sn—Zn—O-based oxide, an Al—Zn—O-based oxide, a Zn—Mg—O-based oxide, a Sn—Mg—O-based oxide, an In—Mg—O-based oxide, or an In—Ga—O-based oxide; and the like.

Figure 14A:
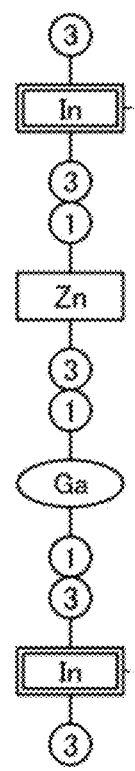
FIGS. 14A to 14C illustrate the structure of an oxide material according to one embodiment of the present invention.

For example, FIG. 14A illustrates a model of a medium group included in a layer structure of an In—Ga—Zn—O-based material.

In the medium group included in the layer structure of the In—Ga—Zn—O-based material in FIG. 14A, in the order starting from the top, an In atom close to three tetracoordinate O atoms in each of an upper half and a lower half is bonded to a Zn atom close to one tetracoordinate O atom in an upper half, the Zn atom is bonded to a Ga atom close to one tetracoordinate O atom in each of an upper half and a lower half through three tetracoordinate O atoms in a lower half with respect to the Zn atom, and the Ga atom is bonded to an In atom close to three tetracoordinate O atoms in each of an upper half and a lower half through one tetracoordinate O atom in a lower half with respect to the Ga atom. A plurality of such medium groups are bonded to each other so that a large group is constituted.

Figure 14B:
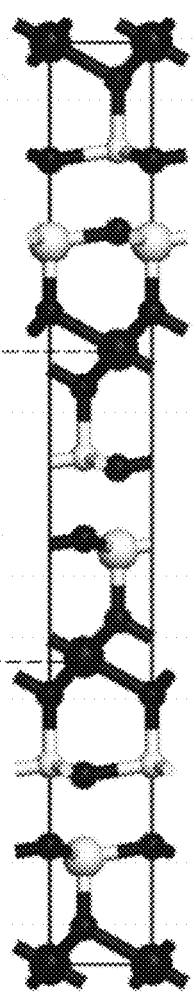
Figure 14C:
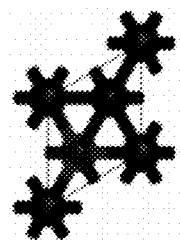

FIG. 14B illustrates a large group including three medium groups. Note that FIG. 14C illustrates atomic order in the case of the layer structure in FIG. 14B observed from the c-axis direction.

Here, since electric charge of a hexacoordinate or pentacoordinate In atom, electric charge of a tetracoordinate Zn atom, and electric charge of a pentacoordinate Ga atom are +3, +2, and +3, respectively, electric charge of a small group including any of an In atom, a Zn atom, and a Ga atom is 0. Thus, the total electric charge of a medium group having a combination of such small groups is always 0.

In order to form the layer structure of the In—Ga—Zn—O-based material, a large group can be formed using not only the medium group illustrated in FIG. 14A but also a medium group in which arrangement of an In atom, a Ga atom, and a Zn atom is different from that in FIG. 14A.

Specifically, when a large group illustrated in FIG. 14B is formed, an In—Ga—Zn—O-based crystal can be obtained. Note that the layer structure of the obtained In—Ga—Zn—O-based crystal can be expressed as a composition formula, $In_2GaO_3(ZnO)_n$ (n is a natural number).

Figure 15A:
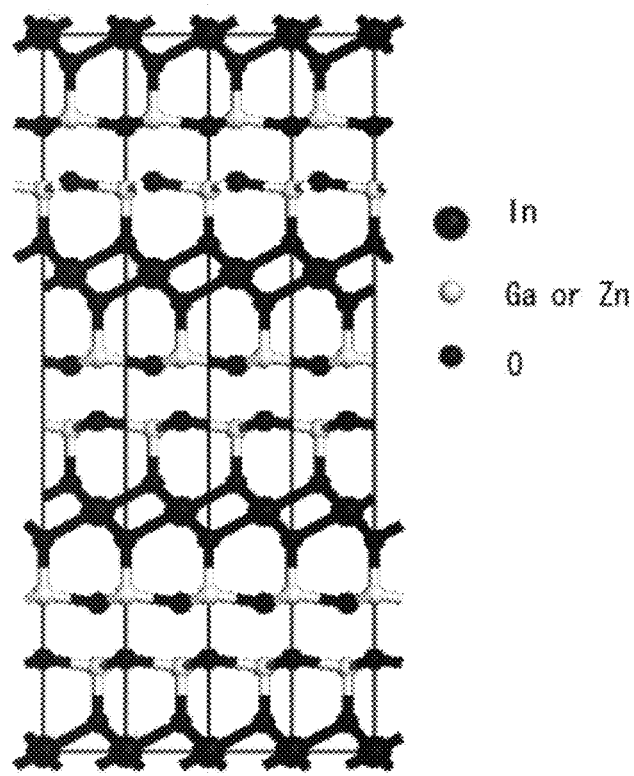
FIGS. 15A and 15B each illustrate the structure of an oxide material according to one embodiment of the present invention.

In the case where n=1 ($InGaZnO_4$), a crystal structure illustrated in FIG. 15A can be obtained, for example. Note that in the crystal structure illustrated in FIG. 15A, since a Ga atom and an In atom each have five ligands as described in FIG. 12B, a structure in which a Ga atom is replaced with an In atom can be obtained.

Figure 15B:
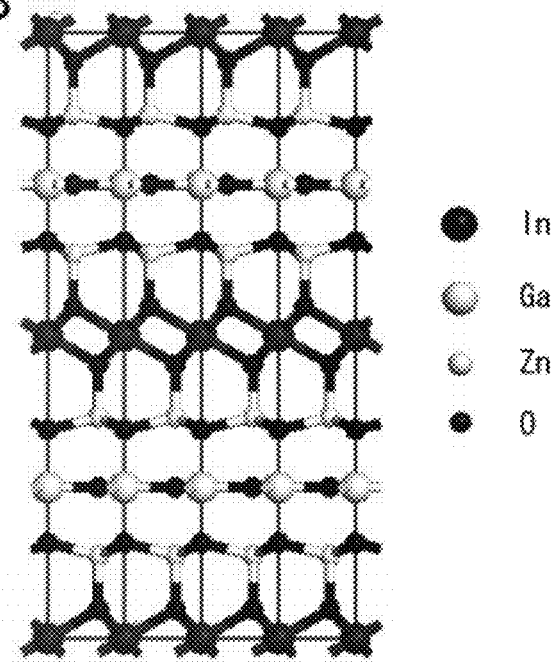

In the case where n=2 ($InGaZn_2O_5$), a crystal structure illustrated in FIG. 15B can be obtained, for example. Note that in the crystal structure illustrated in FIG. 15B, since a Ga atom and an In atom each have five ligands as described in FIG. 12B, a structure in which a Ga atom is replaced with an In atom can be obtained.

This embodiment can be combined with any of the other embodiments disclosed in this specification as appropriate.

This application is based on Japanese Patent Application serial No. 2011-113011 filed with Japan Patent Office on May 20, 2011, the entire contents of which are hereby incorporated by reference.

What is claimed is:

1. A storage device comprising:
a word line;
a first sub word line;
a second sub word line;
a first transistor; a second transistor;
a first selection transistor;
a second selection transistor;
a first capacitor; and
a second capacitor,
wherein a gate of the first selection transistor is electrically connected to the first sub word line,
wherein a gate of the second selection transistor is electrically connected to the second sub word line,
wherein the first capacitor is electrically connected to one of a source and a drain of the first selection transistor,
wherein the second capacitor is electrically connected to one of a source and a drain of the second selection transistor,
wherein one of a source and a drain of the first transistor and one of a source and a drain of the second transistor are electrically connected to the word line,
wherein the other of the source and the drain of the first transistor is electrically connected to the first sub word line,
wherein the other of the source and the drain of the second transistor is electrically connected to the second sub word line,
wherein off-state leakage current per micrometer of channel width of each of the first transistor and the second transistor is $1 \times 10^{-17}$ A or lower,
wherein the first transistor, the first selection transistor and the first capacitor overlap each other, and
wherein the second transistor, the second selection transistor and the second capacitor overlap each other.

2. The storage device according to claim 1, wherein each of the first transistor and the second transistor comprises a channel, and the channel comprises an oxide semiconductor.

3. The storage device according to claim 1, comprising:
a first memory cell comprising the first selection transistor and the first capacitor; and
a second memory cell comprising the second selection transistor and the second capacitor.

4. The storage device according to claim 3, wherein each of the first memory cell and the second memory cell is a DRAM.

5. The storage device according to claim 1,
wherein each of the first selection transistor and the second selection transistor comprises a channel comprising an oxide semiconductor.

6. The storage device according to claim 1, further comprising a third transistor and a fourth transistor,
wherein the one of the source and the drain of the first selection transistor is electrically connected to a gate of the third transistor and the first capacitor, and
wherein the one of the source and the drain of the second selection transistor is electrically connected to a gate of the fourth transistor and the second capacitor.

7. The storage device according to claim 1,
wherein each of the first selection transistor and the second selection transistor comprises a channel comprising silicon.

8. A storage device comprising:
a first bit line;
a second bit line;
a word line;
a first sub word line;
a second sub word line;
a first transistor;
a second transistor;
a first memory cell comprising a first selection transistor and a first data retention portion comprising a first capacitor; and
a second memory cell comprising a second selection transistor and a second data retention portion comprising a second capacitor,
wherein one of a source and a drain of the first selection transistor is electrically connected to the first bit line,
wherein one of a source and a drain of the second selection transistor is electrically connected to the second bit line,
wherein the other of the source and the drain of the first selection transistor is electrically connected to the first data retention portion,
wherein the other of the source and the drain of the second selection transistor is electrically connected to the second data retention portion,
wherein a gate of the first selection transistor is electrically connected to the first sub word line, wherein a gate of the second selection transistor is electrically connected to the second sub word line,
wherein one of a source and a drain of the first transistor and one of a source and a drain of the second transistor are electrically connected to the word line,
wherein the other of the source and the drain of the first transistor is electrically connected to the first sub word line,
wherein the other of the source and the drain of the second transistor is electrically connected to the second sub word line,
wherein off-state leakage current per micrometer of channel width of each of the first transistor and the second transistor is $1 \times 10^{-17}$ A or lower,
wherein the first transistor, the first selection transistor and the first capacitor overlap each other, and
wherein the second transistor, the second selection transistor and the second capacitor overlap each other.

9. The storage device according to claim 8, wherein each of the first memory cell and the second memory cell is a DRAM.

10. The storage device according to claim 8, wherein off-state leakage current per micrometer of channel width of each of the first selection transistor and the second selection transistor is $1 \times 10^{-17}$ A or lower.

11. The storage device according to claim 8, wherein each of the first selection transistor and the second selection transistor comprises a channel, and the channel comprises an oxide semiconductor.

12. The storage device according to claim 8,
wherein the first capacitor is electrically connected to the other of the source and the drain of the first selection transistor,
wherein the second capacitor is electrically connected to the other of the source and the drain of the second selection transistor, and
wherein the first selection transistor and the second selection transistor comprising a channel comprising an oxide semiconductor.

13. The storage device according to claim 8,
wherein the first data retention portion comprises a third transistor,
wherein the second data retention portion comprises a fourth transistor,
wherein a gate of the third transistor and the first capacitor are electrically connected to the other of the source and the drain of the first selection transistor,
wherein a gate of the fourth transistor and the second capacitor are electrically connected to the other of the source and the drain of the second selection transistor, and
wherein the first selection transistor and the second selection transistor comprising a channel comprising an oxide semiconductor.

14. The storage device according to claim 8, wherein each of the first transistor and the second transistor comprises a channel, and the channel comprises an oxide semiconductor.

15. The storage device according to claim 8, wherein each of the first selection transistor and the second selection transistor comprises a channel, and the channel comprises silicon.

16. A storage device comprising:
a word line;
a first sub word line;
a second sub word line;
a first transistor;
a second transistor;
a first selection transistor;
a second selection transistor;
a first capacitor; and
a second capacitor,
wherein a gate of the first selection transistor is electrically connected to the first sub word line,
wherein a gate of the second selection transistor is electrically connected to the second sub word line,
wherein the first capacitor is electrically connected to one of a source and a drain of the first selection transistor,
wherein the second capacitor is electrically connected to one of a source and a drain of the second selection transistor,
wherein one of a source and a drain of the first transistor and one of a source and a drain of the second transistor are electrically connected to the word line,
wherein the other of the source and the drain of the first transistor is electrically connected to the first sub word line,
wherein the other of the source and the drain of the second transistor is electrically connected to the second sub word line,
wherein the first transistor and the second transistor comprise an oxide semiconductor,
wherein carrier concentration of each of the first transistor and the second transistor is lower than $1 \times 10^{11}/cm^3$,
wherein the first transistor, the first selection transistor and the first capacitor overlap each other, and
wherein the second transistor, the second selection transistor and the second capacitor overlap each other.

17. The storage device according to claim 16, comprising:
a first memory cell comprising the first selection transistor and the first capacitor; and
a second memory cell comprising the second selection transistor and the second capacitor.

18. The storage device according to claim 16,
wherein each of the first selection transistor and the second selection transistor comprises a channel, and the channel comprises silicon.

19. A storage device comprising:
a first bit line;
a second bit line;
a word line;
a first sub word line;
a second sub word line;
a first transistor;
a second transistor;
a first memory cell comprising a first selection transistor and a first data retention portion comprising a first capacitor; and
a second memory cell comprising a second selection transistor and a second data retention portion comprising a second capacitor,
wherein one of a source and a drain of the first selection transistor is electrically connected to the first bit line,
wherein one of a source and a drain of the second selection transistor is electrically connected to the second bit line,
wherein the other of the source and the drain of the first selection transistor is electrically connected to the first data retention portion,
wherein the other of the source and the drain of the second selection transistor is electrically connected to the second data retention portion,
wherein a gate of the first selection transistor is electrically connected to the first sub word line, wherein a gate of the second selection transistor is electrically connected to the second sub word line, wherein one of a source and a drain of the first transistor and one of a source and a drain of the second transistor are electrically connected to the word line, wherein the other of the source and the drain of the first transistor is electrically connected to the first sub word line, wherein the other of the source and the drain of the second transistor is electrically connected to the second sub word line, wherein the first transistor and the second transistor comprise an oxide semiconductor, wherein carrier concentration of each of the first transistor and the second transistor is lower than $1\times10^{11}/cm^3$, wherein the first transistor, the first selection transistor and the first capacitor overlap each other, and wherein the second transistor, the second selection transistor and the second capacitor overlap each other.

20. The storage device according to claim 19, wherein each of the first memory cell and the second memory cell is a DRAM.

21. The storage device according to claim 19, wherein the first selection transistor and the second selection transistor comprise an oxide semiconductor.

22. The storage device according to claim 19, wherein each of the first selection transistor and the second selection transistor comprises a channel, and the channel comprises silicon.

23. A storage device comprising:
a word line;
a first sub word line;
a second sub word line;
a first transistor;
a second transistor;
a first selection transistor;
a second selection transistor;
a first capacitor; and
a second capacitor,
wherein a gate of the first selection transistor is electrically connected to the first sub word line,
wherein a gate of the second selection transistor is electrically connected to the second sub word line,
wherein the first capacitor is electrically connected to one of a source and a drain of the first selection transistor,
wherein the second capacitor is electrically connected to one of a source and a drain of the second selection transistor,
wherein one of a source and a drain of the first transistor and one of a source and a drain of the second transistor are electrically connected to the word line,
wherein the other of the source and the drain of the first transistor is electrically connected to the first sub word line,
wherein the other of the source and the drain of the second transistor is electrically connected to the second sub word line,
wherein the first transistor and the second transistor comprise an oxide semiconductor layer over an insulating layer, the oxide semiconductor layer including a channel formation region; a pair of metal layers over and in contact with the oxide semiconductor layer; a gate insulating layer over the oxide semiconductor layer and the pair of metal layers; and a gate electrode layer over the channel formation region with the gate insulating layer therebetween,
wherein the first transistor, the first selection transistor and the first capacitor overlap each other, and
wherein the second transistor, the second selection transistor and the second capacitor overlap each other.

24. The storage device according to claim 23, comprising:
a first memory cell comprising the first selection transistor and the first capacitor; and
a second memory cell comprising the second selection transistor and the second capacitor.

25. The storage device according to claim 24, wherein each of the first memory cell and the second memory cell is a DRAM.

26. The storage device according to claim 23,
wherein each of the first selection transistor and the second selection transistor comprises a channel comprising an oxide semiconductor.

27. The storage device according to claim 23, further comprising a third transistor and a fourth transistor,
wherein the one of the source and the drain of the first selection transistor is electrically connected to a gate of the third transistor and the first capacitor, and
wherein the one of the source and the drain of the second selection transistor is electrically connected to a gate of the fourth transistor and the second capacitor.

28. The storage device according to claim 23,
wherein each of the first selection transistor and the second selection transistor comprises a channel comprising silicon.

* * * * *